(12) United States Patent
Liu et al.

(10) Patent No.: US 10,432,166 B2
(45) Date of Patent: Oct. 1, 2019

(54) PIEZOELECTRIC THIN FILM RESONATOR, FILTER, AND MULTIPLEXER

(71) Applicant: TAIYO YUDEN CO., LTD., Tokyo (JP)

(72) Inventors: Jiansong Liu, Tokyo (JP); Tokihiro Nishihara, Tokyo (JP); Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 2 days.

(21) Appl. No.: 15/616,066

(22) Filed: Jun. 7, 2017

(65) Prior Publication Data

US 2017/0366157 A1    Dec. 21, 2017

(30) Foreign Application Priority Data

Jun. 16, 2016 (JP) .................. 2016-120163

(51) Int. Cl.
*H03H 9/02* (2006.01)
*H03H 3/04* (2006.01)
(Continued)

(52) U.S. Cl.
CPC .......... *H03H 9/02015* (2013.01); *H03H 3/02* (2013.01); *H03H 3/04* (2013.01);
(Continued)

(58) Field of Classification Search
CPC ........ H03H 9/02015; H03H 3/02; H03H 3/04; H03H 9/02118; H03H 9/173; H03H 9/174; H03H 9/568; H03H 9/706
See application file for complete search history.

(56) References Cited

U.S. PATENT DOCUMENTS

| 9,048,812 B2 | 6/2015 | Burak et al. |
| 2006/0071736 A1 | 4/2006 | Ruby et al. |

(Continued)

FOREIGN PATENT DOCUMENTS

| JP | 2006-109472 A | 4/2006 |
| JP | 2011-41136 A | 2/2011 |

(Continued)

OTHER PUBLICATIONS

Japanese Office Action dated Jan. 8, 2019, in a counterpart Japanese patent application No. 2016-120163. (A machine translation (not reviewed for accuracy) attached.).

*Primary Examiner* — Stephen E. Jones
*Assistant Examiner* — Samuel S Outten
(74) *Attorney, Agent, or Firm* — Chen Yoshimura LLP

(57) ABSTRACT

A piezoelectric thin film resonator includes: a substrate; a piezoelectric film located on the substrate; lower and upper electrodes facing each other across at least a part of the piezoelectric film; a first insertion layer located between the lower and upper electrodes and located in at least a part of an outer peripheral region within a resonance region in which the lower and upper electrodes face each other across the piezoelectric film, the first insertion layer being not located in a center region of the resonance region; and a second insertion layer located between the lower and upper electrodes and located in at least a part of the outer peripheral region, the second insertion layer being not located in the center region, a position of an edge of the second insertion layer being different from a position of an edge of the first insertion film in the resonance region.

11 Claims, 21 Drawing Sheets

(51) Int. Cl.
  *H03H 9/17* (2006.01)
  *H03H 9/56* (2006.01)
  *H03H 9/70* (2006.01)
  *H03H 3/02* (2006.01)

(52) U.S. Cl.
  CPC ........ *H03H 9/02118* (2013.01); *H03H 9/173* (2013.01); *H03H 9/174* (2013.01); *H03H 9/175* (2013.01); *H03H 9/568* (2013.01); *H03H 9/706* (2013.01); *H03H 2003/0435* (2013.01)

(56) References Cited

U.S. PATENT DOCUMENTS

| | | |
|---|---|---|
| 2006/0103492 A1 | 5/2006 | Feng et al. |
| 2010/0033063 A1* | 2/2010 | Nishihara .......... H03H 9/02118 310/365 |
| 2012/0146744 A1 | 6/2012 | Nishihara et al. |
| 2012/0200199 A1 | 8/2012 | Taniguchi et al. |
| 2012/0200373 A1* | 8/2012 | Taniguchi .......... H03H 9/02086 333/189 |
| 2012/0218057 A1* | 8/2012 | Burak ................ H03H 9/02007 333/191 |
| 2014/0210570 A1 | 7/2014 | Nishihara et al. |
| 2015/0207490 A1 | 7/2015 | Taniguchi et al. |

FOREIGN PATENT DOCUMENTS

| | | |
|---|---|---|
| JP | 2011-91639 A | 5/2011 |
| JP | 2014-161001 A | 9/2014 |
| JP | 2015-139167 A | 7/2015 |

\* cited by examiner

FIG. 19

| SAMPLE | Q-VALUE AT ANTIRESONANT FREQUENCY | $K^2$ |
|---|---|---|
| A | 2450 | 7.03% |
| B | 2207 | 7.25% |
| C | 2260 | 7.26% |
| D | 2560 | 7.21% |
| E | 2300 | 7.28% |
| F | 2335 | 7.27% |

PIEZOELECTRIC THIN FILM RESONATOR, FILTER, AND MULTIPLEXER

CROSS-REFERENCE TO RELATED APPLICATION

This application is based upon and claims the benefit of priority of the prior Japanese Patent Application No. 2016-120163, filed on Jun. 16, 2016, the entire contents of which are incorporated herein by reference.

FIELD

A certain aspect of the present invention relates to a piezoelectric thin film resonator, a filter, and a multiplexer.

BACKGROUND

Acoustic wave devices using piezoelectric thin film resonators have been used as filters and multiplexers for wireless devices such as, for example, mobile phones. The piezoelectric thin film resonator has a structure designed to have a lower electrode and an upper electrode facing each other across a piezoelectric film. The region where the lower electrode and the upper electrode face each other across the piezoelectric film is a resonance region.

Rapid diffusion of wireless systems has promoted the use of many frequency bands. As a result, the skirt characteristics of the filter and the duplexer have been desired to be steep. One way of steepening the skirt characteristics is to increase the Q-value of the piezoelectric thin film resonator.

Japanese Patent Application Publication No. 2006-109472 (hereinafter, referred to as Patent Document 1) describes a piezoelectric thin film resonator including an annulus located on one of the surfaces of each of the upper electrode and the lower electrode. Japanese Patent Application Publication No. 2014-161001 (hereinafter, referred to as Patent Document 2) describes a piezoelectric thin film resonator including an insertion layer inserted in the piezoelectric film in the outer peripheral region of the resonance region. U.S. Pat. No. 9,048,812 (hereinafter, referred to as Patent Document 3) describes a piezoelectric thin film resonator including an annulus called a bridge in the piezoelectric film.

The piezoelectric thin film resonators disclosed in Patent Documents 1 through 3 reduce the leak of the acoustic wave energy from the resonance region, improving the Q-value. However, it is difficult to sufficiently reduce the leak of the acoustic wave energy from the resonance region, and the degree of improvement of the Q-value is thus insufficient. Additionally, the provision of the insertion layer may decrease the electromechanical coupling coefficient.

SUMMARY OF THE INVENTION

According to a first aspect of the present invention, there is provided a piezoelectric thin film resonator including: a substrate; a piezoelectric film located on the substrate; a lower electrode and an upper electrode facing each other across at least a part of the piezoelectric film; a first insertion layer located between the lower electrode and the upper electrode and located in at least a part of an outer peripheral region within a resonance region in which the lower electrode and the upper electrode face each other across the piezoelectric film, the first insertion layer being not located in a center region of the resonance region; and a second insertion layer located between the lower electrode and the upper electrode and located in at least a part of the outer peripheral region within the resonance region, the second insertion layer being not located in the center region of the resonance region, a position of an edge of the second insertion layer in the resonance region being different from a position of an edge of the first insertion film in the resonance region.

According to a second aspect of the present invention, there is provided a filter including the above piezoelectric thin film resonator.

According to a third aspect of the present invention, there is provided a multiplexer including the above filter.

BRIEF DESCRIPTION OF THE DRAWINGS

FIG. 19 presents the Q-value at the antiresonant frequency and the electromechanical coupling coefficient $k^2$ in the samples A through F;

DETAILED DESCRIPTION

Hereinafter, a description will be given of embodiments of the present invention with reference to the accompanying drawings.

First Embodiment

Figure 1A:
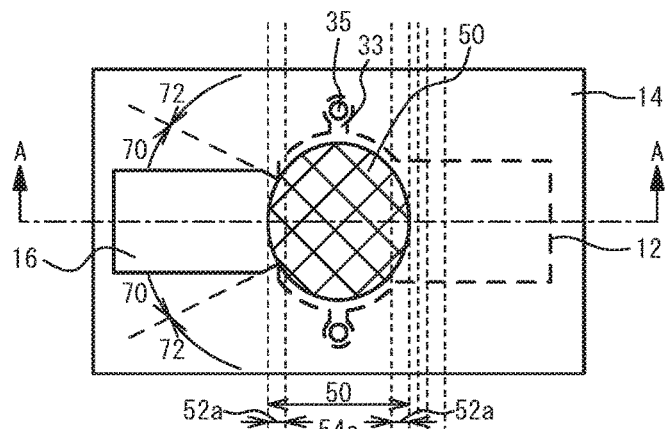
FIG. 1A is a plan view of a piezoelectric thin film resonator in accordance with a first embodiment.
Figure 1B:
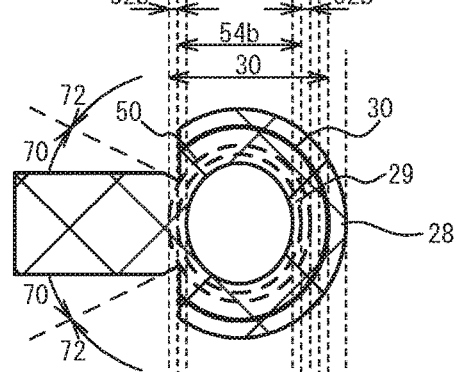
FIG. 1B is a plan view of an insertion layer and an air gap.
Figure 1C:
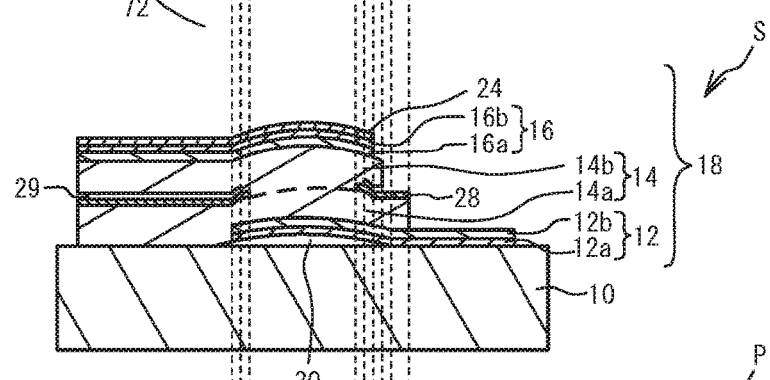
FIG. 1C and FIG. 1D are cross-sectional views taken along line A-A in FIG. 1A.
Figure 1D:
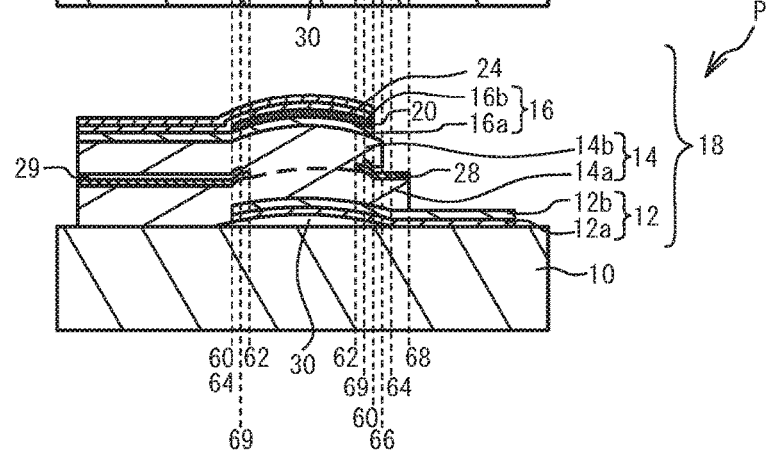

FIG. 1A is a plan view of a piezoelectric thin film resonator in accordance with a first embodiment, FIG. 1B is a plan view of an insertion layer and an air gap, and FIG. 1C and FIG. 1D are cross-sectional views taken along line A-A in FIG. 1A. FIG. 1C illustrates, for example, a series resonator of a ladder-type filter, and FIG. 1D illustrates, for example, a parallel resonator of the ladder-type filter.

With reference to FIG. 1A and FIG. 1C, the structure of a series resonator S will be described. A lower electrode 12 is located on a substrate 10 that is a silicon (Si) substrate. An air gap 30 having a dome-shaped bulge is formed between a flat principal surface of the substrate 10 and the lower electrode 12. The dome-shaped bulge is a bulge having a shape in which the height of the air gap 30 is low near the periphery of the air gap 30 and increases at closer distances to the center of the air gap 30, for example. The lower electrode 12 includes a lower layer 12a and an upper layer 12b. The lower layer 12a is formed of, for example, a chrome (Cr) film, and the upper layer 12b is formed of, for example, a ruthenium (Ru) film.

Located on the lower electrode 12 is a piezoelectric film 14 mainly composed of aluminum nitride (AlN) having the main axis in the (002) direction. The piezoelectric film 14 includes a lower piezoelectric film 14a and an upper piezoelectric film 14b. Insertion layers 28 and 29 are located between the lower and upper piezoelectric films 14a and 14b. The insertion layers 28 and 29 are in contact with each other in the stacking direction. The insertion layer 28 is a material layer such as an insulating layer or a conductive layer filled with a solid material. The insertion layer 29 is an air layer. The insertion layer 28 is an insertion layer closer to the lower electrode 12, and the insertion layer 29 is an insertion layer closer to the upper electrode 16.

An upper electrode 16 is located on the piezoelectric film 14 so as to have a region (a resonance region 50) in which the upper electrode 16 faces the lower electrode 12 across the piezoelectric film 14. The resonance region 50 has an elliptical shape, and is a region in which the acoustic wave in the thickness extension mode resonates. The upper electrode 16 includes a lower layer 16a and an upper layer 16b. The lower layer 16a is formed of, for example, a Ru film, and the upper layer 16b is formed of, for example, a Cr film. At least a part of the upper electrode 16 and at least a part of the lower electrode 12 are located above the air gap 30, and face each other in the stacking direction.

A silicon oxide film as a frequency adjusting film 24 is formed on the upper electrode 16. A multilayered film 18 in the resonance region 50 includes the lower electrode 12, the piezoelectric film 14, the upper electrode 16, and the frequency adjusting film 24. The frequency adjusting film 24 may act as a passivation film.

As illustrated in FIG. 1A, an introduction path 33 for etching a sacrifice layer is formed in the lower electrode 12. The sacrifice layer is a layer for forming the air gap 30. The end portion of the introduction path 33 is not covered with the piezoelectric film 14, and the lower electrode 12 has a hole portion 35 in the end of the introduction path 33.

With reference to FIG. 1D, the structure of a parallel resonator P will be described. The parallel resonator P differs from the series resonator S in that a mass load film 20 formed of a titanium (Ti) layer is located between the upper and lower layers 16a and 16b of the upper electrode 16. Thus, the multilayered film 18 includes, in addition to the multilayered film of the series resonator S, the mass load film 20 formed across the entire surface in the resonance region 50. Other structures are the same as those of the series resonator S illustrated in FIG. 1C, and the description thereof is thus omitted.

The difference in resonant frequency between the series resonator S and the parallel resonator P is adjusted by using the film thickness of the mass load film 20. The resonant frequency of each of the series resonator S and the parallel resonator P is adjusted by adjusting the film thickness of the corresponding frequency adjusting film 24.

When the piezoelectric thin film resonator has a resonant frequency of 2 GHz, the lower layer 12a of the lower electrode 12 is configured to be a Cr film with a film thickness of 100 nm, and the upper layer 12b is configured to be a Ru film with a film thickness of 200 nm. The piezoelectric film 14 is configured to be an AlN film with a film thickness of 1200 nm. The insertion layer 28 is configured to be a silicon oxide ($SiO_2$) film with a film thickness of 150 nm. The insertion layer 29 is configured to be an air layer with a film thickness of 150 nm. The insertion layers 28 and 29 are located in the middle of the piezoelectric film 14 in the film thickness direction. The lower layer 16a of the upper electrode 16 is configured to be a Ru film with a film thickness of 230 nm, and the upper layer 16b is configured to be a Cr film with a film thickness of 50 nm. The frequency adjusting film 24 is configured to be a silicon oxide film with a film thickness of 50 nm. The mass load film 20 is configured to be a Ti film with a film thickness of 120 nm. The film thickness of each layer may be appropriately configured to achieve desired resonance characteristics.

As illustrated in FIG. 1B, the insertion layer 28 is located in an outer peripheral region 52a within the resonance region 50, and is not located in a center region 54a. The insertion layer 29 is located in an outer peripheral region 52b within the resonance region 50, and is not located in a center region 54b. The outer peripheral regions 52a and 52b are regions within the resonance region 50, include the outer periphery of the resonance region 50, and are located along the outer periphery. The outer peripheral regions 52a and 52b have, for example, a strip shape or a ring shape. The center regions 54a and 54b are regions within the resonance region 50, and include the center of the resonance region 50.

The center may not be necessarily a geometric center. The position of an inner outline 62 of the insertion layer 28 differs from the position of an inner outline 69 of the insertion layer 29.

As described in Patent Document 2, Young's modulus of the insertion layer 28 is preferably less than that of the piezoelectric film 14. When the insertion layer 28 and the piezoelectric film 14 have approximately the same density, the acoustic impedance of the insertion layer 28 is preferably less than the acoustic impedance of the piezoelectric film 14 since Young's modulus correlates with acoustic impedance. This configuration improves the Q-value. Furthermore, when the piezoelectric film 14 is mainly composed of aluminum nitride, to make the acoustic impedance of the insertion layer 28 less than that of the piezoelectric film 14, the insertion layer 28 is preferably formed of an Al film, a gold (Au) film, a copper (Cu) film, a Ti film, a platinum (Pt) film, a tantalum (Ta) film, a Cr film, or a silicon oxide film. Especially, in consideration of Young's modulus, the insertion layer 28 is preferably an Al film or a silicon oxide film.

Both the insertion layers 28 and 29 may be air layers, or one of them may be an air layer. Both the insertion layers 28 and 29 may be material layers, or one of them may be a material layer.

The substrate 10 may be a quartz substrate, a glass substrate, a ceramic substrate, or a GaAs substrate instead of a Si substrate. The lower electrode 12 and the upper electrode 16 may be formed of a single-layer film of Al, Ti, Cu, molybdenum (Mo), tungsten (W), Ta, Pt, rhodium (Rh), or iridium (Jr) instead of Ru and Cr, or a multilayered film of at least two of them. For example, the lower layer 16a of the upper electrode 16 may be made of Ru, and the upper layer 16b may be made of Mo.

The piezoelectric film 14 may be made of zinc oxide (ZnO), lead zirconate titanate (PZT), or lead titanate (PbTiO$_3$) instead of aluminum nitride. Alternatively, for example, the piezoelectric film 14 may be mainly composed of aluminum nitride, and may contain other elements for improving the resonance characteristics or the piezoelectricity. For example, the use of scandium (Sc), a II-group element and a IV-group element, or a II-group element and a V-group element as additive elements improves the piezoelectricity of the piezoelectric film 14. Accordingly, the effective electromechanical coupling coefficient of the piezoelectric thin film resonator is improved. The II-group element is, for example, calcium (Ca), magnesium (Mg), strontium (Sr), or zinc (Zn). The IV-group element is, for example, Ti, zirconium (Zr), or hafnium (Hf). The V-group element is, for example, Ta, niobium (Nb), or vanadium (V). Yet alternatively, the piezoelectric film 14 may be mainly composed of aluminum nitride, and contain boron (B).

The frequency adjusting film 24 may be a silicon nitride film or an aluminum nitride instead of a silicon oxide film. The mass load film 20 may be a single-layer film of Ru, Cr, Al, Cu, Mo, W, Ta, Pt, Rh, or Jr instead of Ti. Alternatively, the mass load film 20 may be an insulating film made of, for example, metal nitride such as silicon nitride or metal oxide such as silicon oxide. The mass load film 20 may be formed below the lower electrode 12, between the layers of the lower electrode 12, on the upper electrode 16, between the lower electrode 12 and the piezoelectric film 14, or between the piezoelectric film 14 and the upper electrode 16 instead of between layers of the upper electrode 16 (between the lower and upper layers 16a and 16b). The mass load film 20 may be larger than the resonance region 50 as long as it is formed so as to include the resonance region 50.

Figure 2:
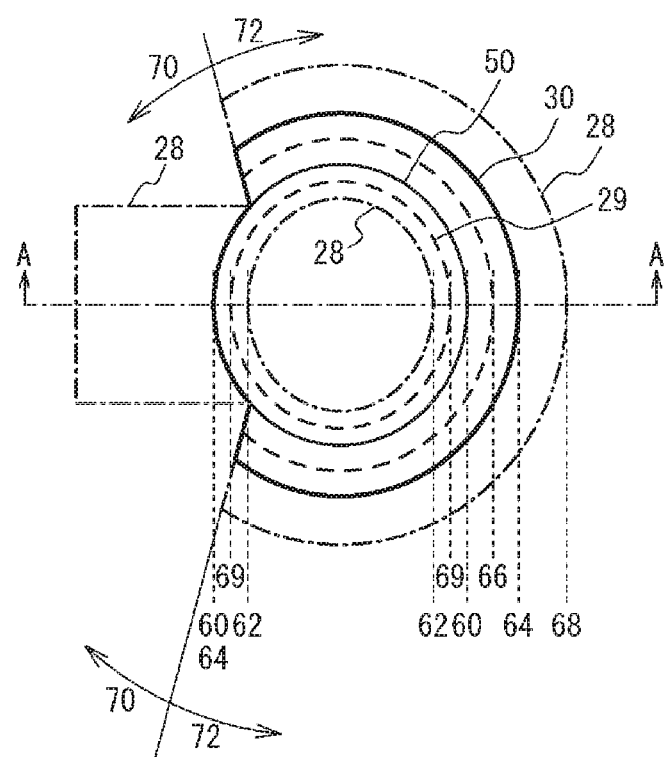
FIG. 2 is a plan view around a resonance region of the piezoelectric thin film resonator in accordance with the first embodiment.
Figure 3A:
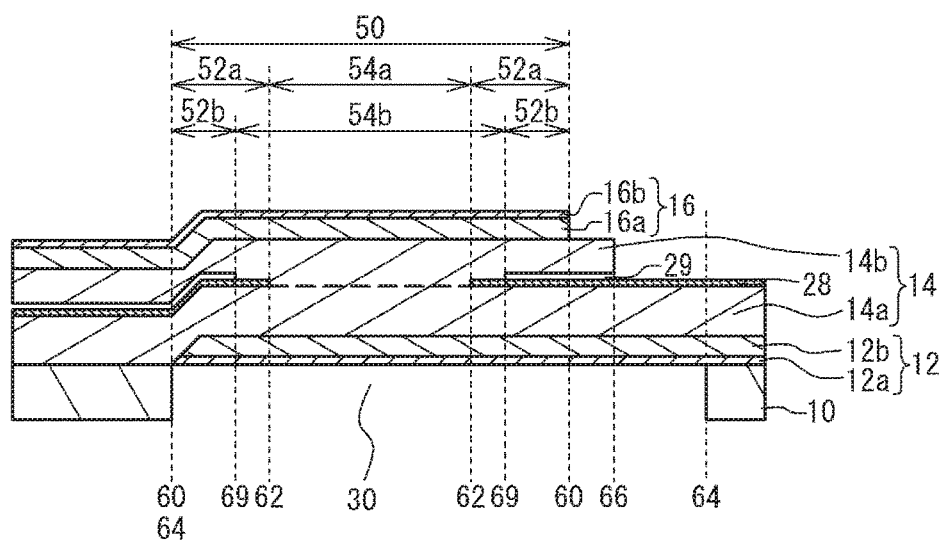
FIG. 3A and FIG. 3B are cross-sectional views taken along line A-A in FIG. 2.
Figure 3B:
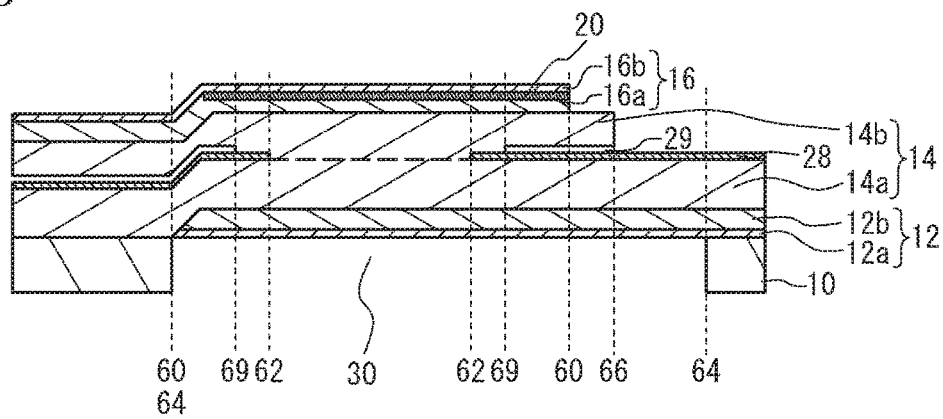

FIG. 2 is a plan view around the resonance region of the piezoelectric thin film resonator in accordance with the first embodiment. FIG. 2 illustrates a positional relation among the resonance region, the insertion layer, the air gap, and the piezoelectric film. FIG. 3A and FIG. 3B are cross-sectional views taken along line A-A in FIG. 2. FIG. 3A illustrates, for example, a series resonator of a ladder-type filter, and FIG. 3B illustrates, for example, a parallel resonator of the ladder-type filter. In FIG. 3A and FIG. 3B, although the air gap 30 has a dome shape, but the upper surface of the air gap 30 is simplistically illustrated with a planar surface. The ratios of the lengths in FIG. 3A and FIG. 3B do not necessarily correspond to those in FIG. 2 for simplicity's sake. The same applies to the drawings hereinafter.

In FIG. 1A through FIG. 3B, illustrated are an outer outline 60, which is the outer outline of the resonance region 50, the inner outline 62, which is the inner outline of the insertion layer 28, the inner outline 69 of the insertion layer 29, an outer outline 64 of the air gap 30, an end face 66 of the upper piezoelectric film 14b, and an end face 68 of the lower piezoelectric film 14a (not illustrated in FIG. 3A or FIG. 3B). Illustrated are an extraction region 70 to which the upper electrode 16 is extracted from the resonance region 50 and a region 72 other than the extraction region 70 in a region surrounding the resonance region 50.

When the end face of a film is tilted or curved in the film thickness direction, the outer outline corresponds to the outermost part of the tilted or curved end face, and the inner outline corresponds to the innermost part of the tilted or curved end face. The end face is considered to be substantially aligned with the outline as long as at least a part of the tilted or curved end face is substantially aligned with the outline. The end face is considered to be located further out than (or further in than) the outline as long as at least a part of the tilted or curved end face is located further out than (or further in than) the outline. Additionally, the term "substantially aligned with" means that two things are aligned with each other to the extent of, for example, variations in the fabrication process or alignment accuracy in the fabrication process.

In the extraction region 70, the outer outline of the lower electrode 12 defines the outer outline 60 of the resonance region 50. In the region 72, the outer outline of the upper electrode 16 defines the outer outline 60 of the resonance region 50. In the extraction region 70, the outer outline 60 of the resonance region 50 is substantially aligned with the outer outline 64 of the air gap 30. In the region 72, the outer outline 64 of the air gap 30 is located further out than the outer outline 60 of the resonance region 50. The inner outline 69 of the insertion layer 29 is located further in than the outer outline 60 of the resonance region 50. The inner outline 62 of the insertion layer 28 is located further in than the inner outline 69 of the insertion layer 29.

Figure 4A:
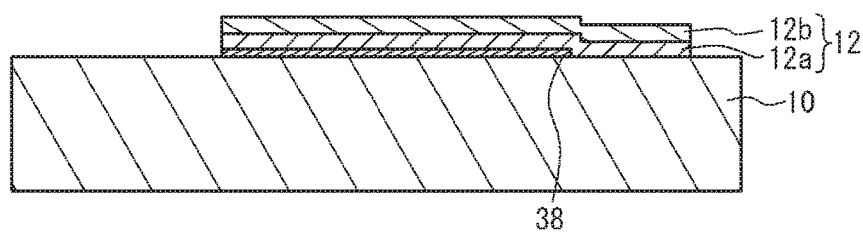
FIG. 4A through FIG. 4C are cross-sectional views (No. 1) illustrating a method of fabricating a series resonator of the first embodiment.

FIG. 4A through FIG. 5B are cross-sectional views illustrating a method of fabricating the series resonator of the first embodiment. As illustrated in FIG. 4A, a sacrifice layer 38 for forming an air gap is formed on the substrate 10 having a flat principal surface. The sacrifice layer 38 has a film thickness of, for example, 10 to 100 nm, and is made of a material selected from materials such as magnesium oxide (MgO), ZnO, germanium (Ge) and silicon oxide (SiO$_2$) that easily dissolve in an etching liquid or an etching gas. Then, the sacrifice layer 38 is patterned into a desired shape by photolithography and etching. The shape of the sacrifice layer 38 corresponds to the planar shape of the air gap 30, and includes, for example, a region to be the resonance region 50. Then, the lower and upper layers 12a and 12b as the lower electrode 12 are formed on the sacrifice layer 38 and the substrate 10. The sacrifice layer 38 and the lower electrode 12 are formed by, for example, sputtering, vacuum evaporation, or Chemical Vapor Deposition (CVD). The lower electrode 12 is then patterned into a desired shape by photolithography and etching. The lower electrode 12 may be formed by liftoff.

Figure 4B:
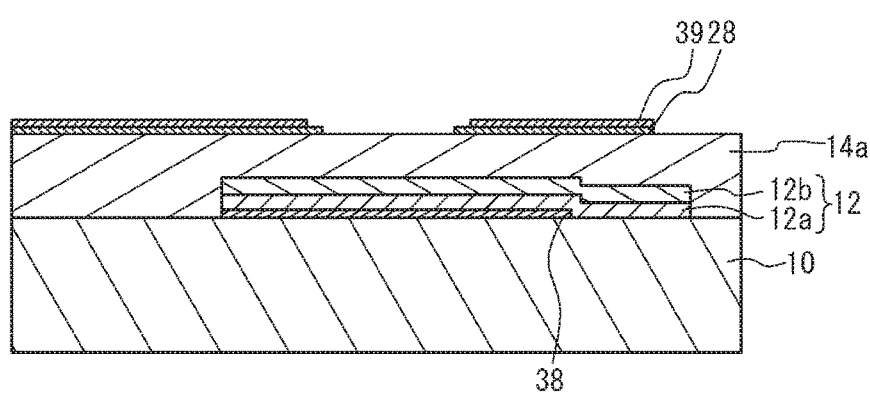

As illustrated in FIG. 4B, the lower piezoelectric film 14a is formed on the lower electrode 12 and the substrate 10 by, for example, sputtering, vacuum evaporation, or CVD. The insertion layer 28 is formed on the lower piezoelectric film 14a by, for example, sputtering, vacuum evaporation, or CVD. The insertion layer 28 is then patterned into a desired shape by photolithography and etching. The insertion layer 28 may be formed by liftoff. A sacrifice layer 39 is formed on the insertion layer 28. The material and the formation method of the sacrifice layer 39 are the same as those of the sacrifice layer 38, and the description thereof is thus omitted.

Figure 4C:
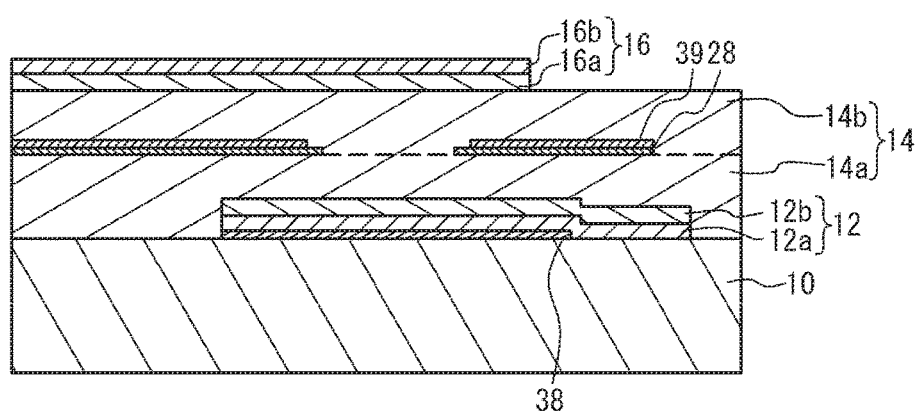

As illustrated in FIG. 4C, the upper piezoelectric film 14b and the lower and upper layers 16a and 16b of the upper electrode 16 are formed by, for example, sputtering, vacuum evaporation, or CVD. The lower and upper piezoelectric films 14a and 14b form the piezoelectric film 14. The upper electrode 16 is patterned into a desired shape by photolithography and etching. The upper electrode 16 may be formed by liftoff.

In the parallel resonator illustrated in FIG. 1D, after the lower layer 16a of the upper electrode 16 is formed, the mass load film 20 is formed by, for example, sputtering, vacuum evaporation, or CVD. The mass load film 20 is patterned into a desired shape by photolithography and etching. Thereafter, the upper layer 16b of the upper electrode 16 is formed.

The frequency adjusting film 24 (not illustrated, see FIG. 1C and FIG. 1D) is formed by, for example, sputtering or CVD. The frequency adjusting film 24 is patterned into a desired shape by photolithography and etching.

Figure 5A:
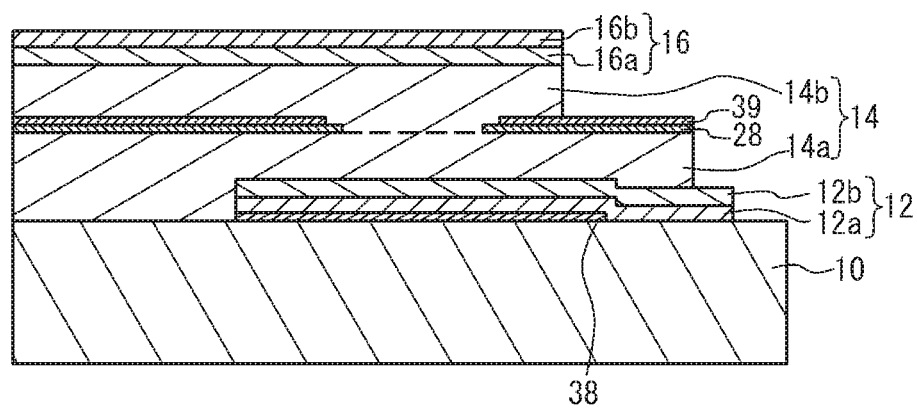
FIG. 5A and FIG. 5B are cross-sectional views (No. 2) illustrating the method of fabricating the series resonator of the first embodiment.

As illustrated in FIG. 5A, the piezoelectric film 14 is patterned into a desired shape by photolithography and etching. The etching may be conducted by wet etching or dry etching. The insertion layers 28 and 29 may be used for at least a part of a mask used to etch the lower piezoelectric film 14a. When the lower piezoelectric film 14a is etched using the insertion layers 28 and 29 as a mask, the outlines of the lower piezoelectric film 14a and the insertion layer 28 are substantially aligned with each other.

Figure 5B:
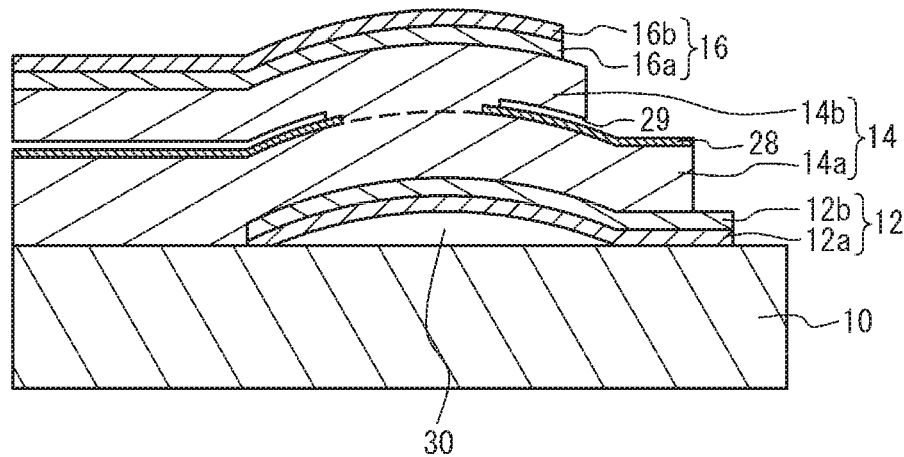

As illustrated in FIG. 5B, an etching liquid for removing the sacrifice layer 38 is introduced to the sacrifice layer 38 below the lower electrode 12 through the hole portion 35 and the introduction path 33 (see FIG. 1A). At this time, the sacrifice layer 39 is also exposed to the etching liquid. Thus, the sacrifice layers 38 and 39 are removed. A substance for etching the sacrifice layers 38 and 39 is preferably a substance that does not etch materials constituting the resonator except the sacrifice layers 38 and 39. Especially, the substance for etching is preferably a substance that does not etch the lower electrode 12 with which the substance for etching comes in contact. The stress of the multilayered film 18 (see FIG. 1C and FIG. 1D) is set so as to be compression stress. This setting causes the multilayered film 18 to bulge out to the opposite side from the substrate 10 so as to separate from the substrate 10 when the sacrifice layer 38 is removed. The air gap 30 having a dome-shaped bulge is formed between the lower electrode 12 and the substrate 10. The sacrifice layer 39 is removed, and thereby, the insertion layer 29, which is an air layer, is formed. The above describe processes complete the series resonator S illustrated in FIG. 1A and FIG. 1C and the parallel resonator P illustrated in FIG. 1A and FIG. 1D.

In the first embodiment, the inner outlines 62 and 69 of the insertion layers 28 and 29 are located in different positions. This structure causes the acoustic wave leaking from the resonance region 50 to be reflected or attenuated by the inner outlines 62 and 69. Therefore, the loss of the acoustic wave energy is small, and the Q-value improves.

First Variation of First Embodiment

Figure 6A:
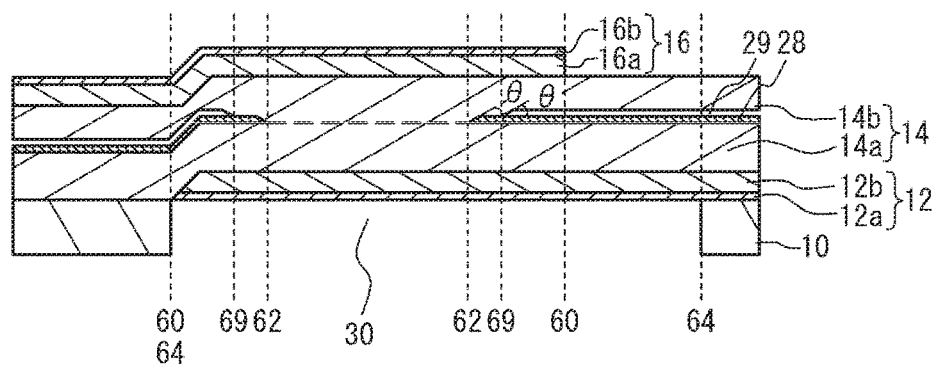
FIG. 6A through FIG. 6C are cross-sectional views of piezoelectric thin film resonators in accordance with first through third variations of the first embodiment.
Figure 6B:
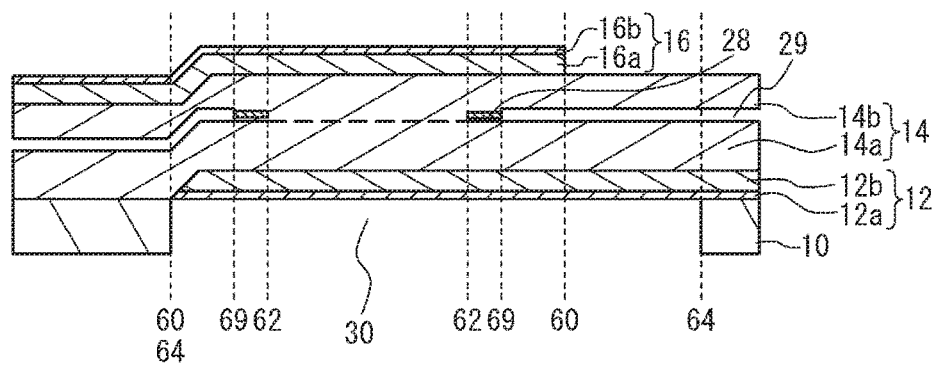
Figure 6C:
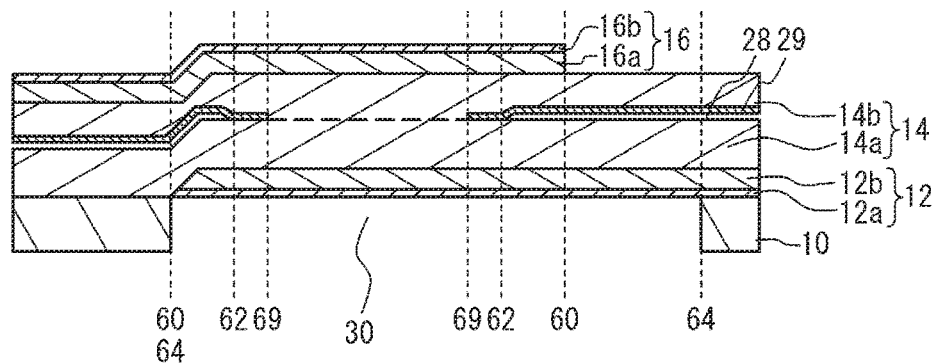

FIG. 6A through FIG. 6C are cross-sectional views of piezoelectric thin film resonators in accordance with first through third variations of the first embodiment. As illustrated in FIG. 6A, the insertion layer 28 is a material layer, and the insertion layer 29 is an air layer. The inner outline 62 of the insertion layer 28 is located further in than the inner outline 69 of the insertion layer 29. The upper piezoelectric film 14b extends to the outside of the outer outline 64 of the air gap 30. The end faces of the insertion layers 28 and 29 are tilted. The upper piezoelectric film 14b may extend to the outside of the outer outline 64 of the air gap 30. Other structures are the same as those of the first embodiment, and the description thereof is thus omitted. As described in the first variation of the first embodiment, the end face of at least one of the insertion layers 28 and 29 may be tilted (i.e., tapered). This structure can reduce cracks in the upper piezoelectric film 14b. The angle θ between the end faces of the insertion layers 28 and 29 and the upper surface of the lower piezoelectric film 14a is preferably 30° or less.

Second Variation of First Embodiment

As illustrated in FIG. 6B, the insertion layer 28 is a material layer, and the insertion layer 29 is an air layer. The insertion layer 28 is located inside the insertion layer 29, and the insertion layers 28 and 29 are in contact with each other in the planar direction. The upper piezoelectric film 14b extends to the outside of the outer outline 64 of the air gap 30. Other structures are the same as those of the first embodiment, and the description thereof is thus omitted. As described in the second variation of the first embodiment, the insertion layers 28 and 29 may be in contact with each other in the planar direction. The insertion layer 28 located inside of the insertion layer 29 may be an air layer, and the insertion layer 29 located outside the insertion layer 28 may be a material layer.

Third Variation of First Embodiment

As illustrated in FIG. 6C, the insertion layer 28 is an air layer, and the insertion layer 29 is a material layer. The inner outline 69 of the insertion layer 29 is located further in than the inner outline 62 of the insertion layer 28. Other structures are the same as those of the first embodiment, and the description thereof is thus omitted. As described in the third variation of the first embodiment, the insertion layer 28 located at the lower side may be an air layer, and the insertion layer 29 located at the upper side may be a material layer.

Fourth Variation of First Embodiment

Figure 7A:
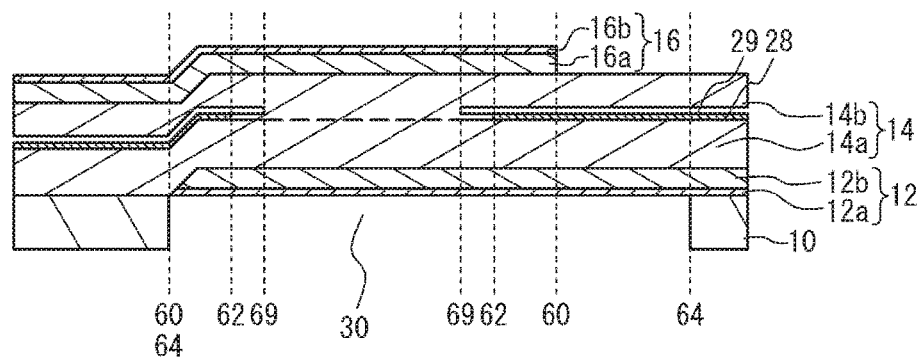
FIG. 7A is a cross-sectional view of a piezoelectric thin film resonator in accordance with a fourth variation of the first embodiment.

FIG. 7A is a cross-sectional view of a piezoelectric thin film resonator in accordance with a fourth variation of the first embodiment. As illustrated in FIG. 7A, the insertion layer 28 is a material layer, and the insertion layer 29 is an air layer. The inner outline 69 of the insertion layer 29 is located further in than the inner outline 62 of the insertion layer 28. The upper piezoelectric film 14b extends to the outside of the outer outline 64 of the air gap 30. Other structures are the same as those of the first embodiment, and the description thereof is thus omitted. As described in the third and fourth variations of the first embodiment, the inner outline 69 of the insertion layer 29 located at the upper side may be located further in than the inner outline 62 of the insertion layer 28 located at the lower side.

Fifth Variation of First Embodiment

Figure 7B:
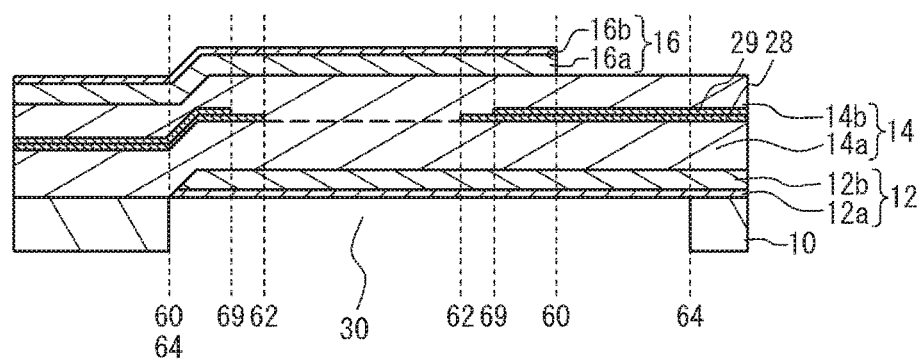
FIG. 7B and FIG. 7C are cross-sectional views of piezoelectric thin film resonators in accordance with a fifth variation of the first embodiment.
Figure 7C:
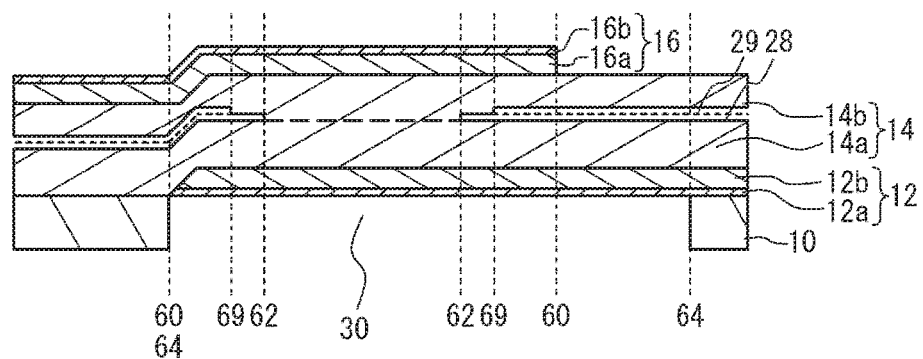

FIG. 7B and FIG. 7C are cross-sectional views of piezoelectric thin film resonators in accordance with a fifth variation of the first embodiment. As illustrated in FIG. 7B, both the insertion layers 28 and 29 are material layers. As illustrated in FIG. 7C, both the insertion layers 28 and 29 are air layers. The inner outline 62 of the insertion layer 28 is located further in than the inner outline 69 of the insertion layer 29. The upper piezoelectric film 14b extends to the outside of the outer outline 64 of the air gap 30. Other structures are the same as those of the first embodiment, and the description thereof is thus omitted. As described in the fifth variation of the first embodiment, the insertion layers 28 and 29 may be material layers made of the same material, or air layers. When both the insertion layers 28 and 29 are material layers, the insertion layers 28 and 29 may be made of different materials.

Sixth Variation of First Embodiment

Figure 8A:
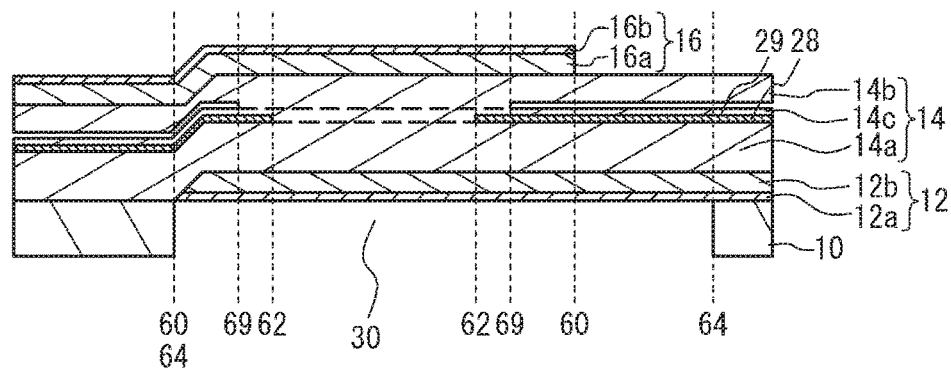
FIG. 8A through FIG. 8C are cross-sectional views of piezoelectric thin film resonators in accordance with a sixth variation of the first embodiment.

FIG. 8A through FIG. 9A are cross-sectional views of piezoelectric thin film resonators in accordance with a sixth variation of the first embodiment. As illustrated in FIG. 8A, the insertion layer 28 is a material layer, and the insertion layer 29 is an air layer. The inner outline 62 of the insertion layer 28 is located further in than the inner outline 69 of the insertion layer 29. An intermediate piezoelectric film 14c is located between the insertion layers 28 and 29. The piezoelectric film 14 includes the lower piezoelectric film 14a, the intermediate piezoelectric film 14c, and the upper piezoelectric film 14b. The upper piezoelectric film 14b extends to the outside of the outer outline 64 of the air gap 30. Other structures are the same as those of the first embodiment, and the description thereof is thus omitted.

Figure 8B:
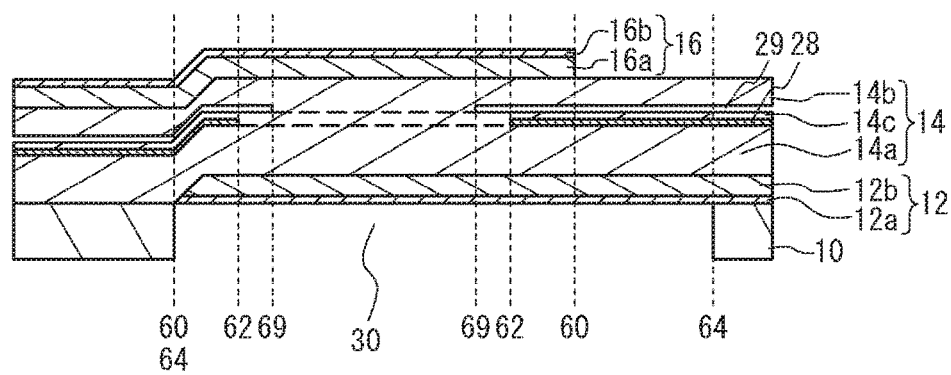

As illustrated in FIG. 8B, the insertion layer 28 is a material layer, and the insertion layer 29 is an air layer. The inner outline 69 of the insertion layer 29 is located further in than the inner outline 62 of the insertion layer 28. The intermediate piezoelectric film 14c is located between the insertion layers 28 and 29. The upper piezoelectric film 14b extends to the outside of the outer outline 64 of the air gap 30. Other structures are the same as those of the first embodiment, and the description thereof is thus omitted.

Figure 8C:
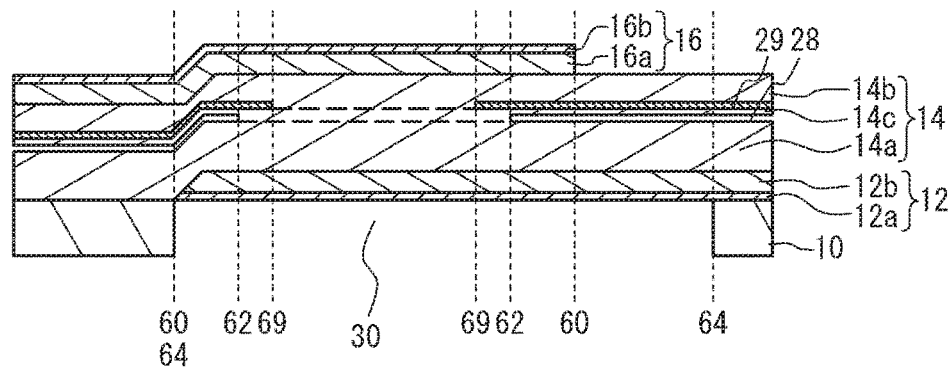

As illustrated in FIG. 8C, the insertion layer 28 is an air layer, and the insertion layer 29 is a material layer. The inner outline 69 of the insertion layer 29 is located further in than the inner outline 62 of the insertion layer 28. The intermediate piezoelectric film 14c is located between the insertion layers 28 and 29. The upper piezoelectric film 14b extends to the outside of the outer outline 64 of the air gap 30. Other structures are the same as those of the first embodiment, and the description thereof is thus omitted.

Figure 9A:
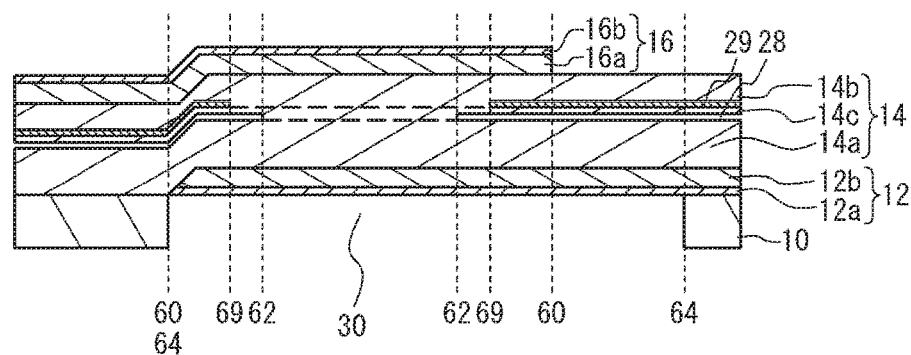
FIG. 9A is a cross-sectional view of a piezoelectric thin film resonator in accordance with the sixth variation of the first embodiment.

As illustrated in FIG. 9A, the insertion layer 28 is an air layer, and the insertion layer 29 is a material layer. The inner outline 62 of the insertion layer 28 is located further in than the inner outline 69 of the insertion layer 29. The intermediate piezoelectric film 14c is located between the insertion layers 28 and 29. The upper piezoelectric film 14b extends to the outside of the outer outline 64 of the air gap 30. Other structures are the same as those of the first embodiment, and the description thereof is thus omitted. As described in the sixth variation of the first embodiment, the insertion layers 28 and 29 may be separated across the intermediate piezoelectric film 14c.

Seventh Variation of First Embodiment

Figure 9B:
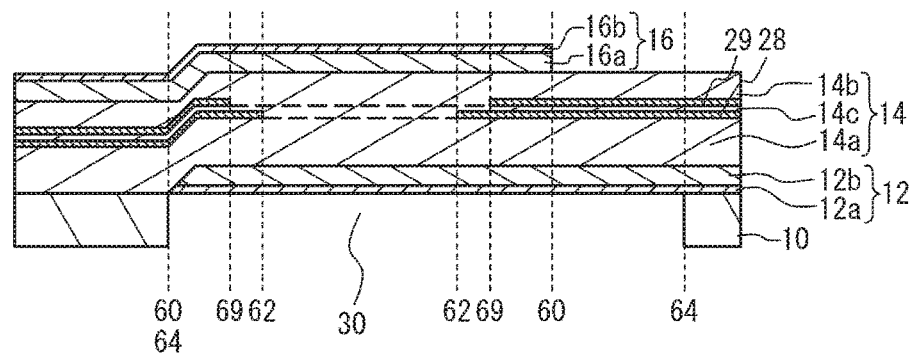
FIG. 9B and FIG. 9C are cross-sectional views of piezoelectric thin film resonators in accordance with a seventh variation of the first embodiment.
Figure 9C:
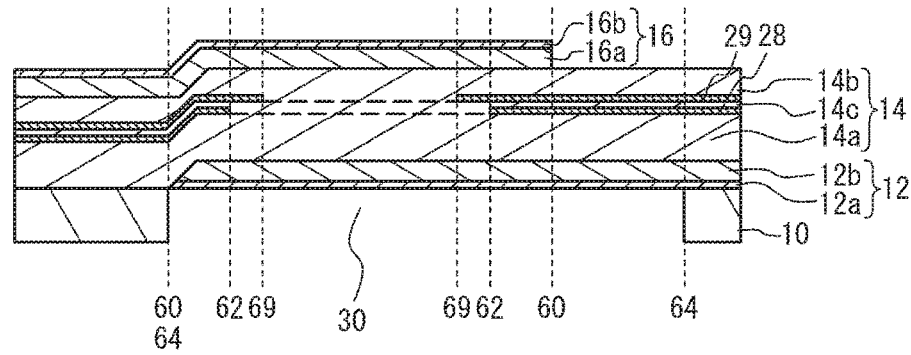

FIG. 9B and FIG. 9C are cross-sectional views of piezoelectric thin film resonators in accordance with a seventh variation of the first embodiment. As illustrated in FIG. 9B, the insertion layers 28 and 29 are material layers. The inner outline 62 of the insertion layer 28 is located further in than the inner outline 69 of the insertion layer 29. The intermediate piezoelectric film 14c is located between the insertion layers 28 and 29. The upper piezoelectric film 14b extends to the outside of the outer outline 64 of the air gap 30. Other structures are the same as those of the first embodiment, and the description thereof is thus omitted.

As illustrated in FIG. 9C, the insertion layers 28 and 29 are material layers. The inner outline 69 of the insertion layer 29 is located further in than the inner outline 62 of the insertion layer 28. The intermediate piezoelectric film 14c is located between the insertion layers 28 and 29. The upper piezoelectric film 14b extends to the outside of the outer outline 64 of the air gap 30. Other structures are the same as those of the first embodiment, and the description thereof is thus omitted. As described in the seventh variation of the first embodiment, when both the insertion layers 28 and 29 are material layers or air layers, the insertion layers 28 and 29 may be separated across the intermediate piezoelectric film 14c.

Eighth Variation of First Embodiment

Figure 10A:
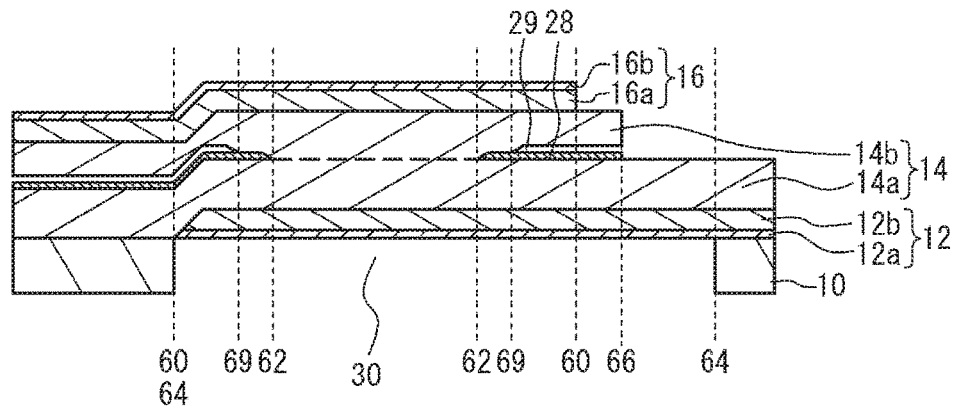
FIG. 10A through FIG. 10C are cross-sectional views of piezoelectric thin film resonators in accordance with an eighth variation of the first embodiment.
Figure 10B:
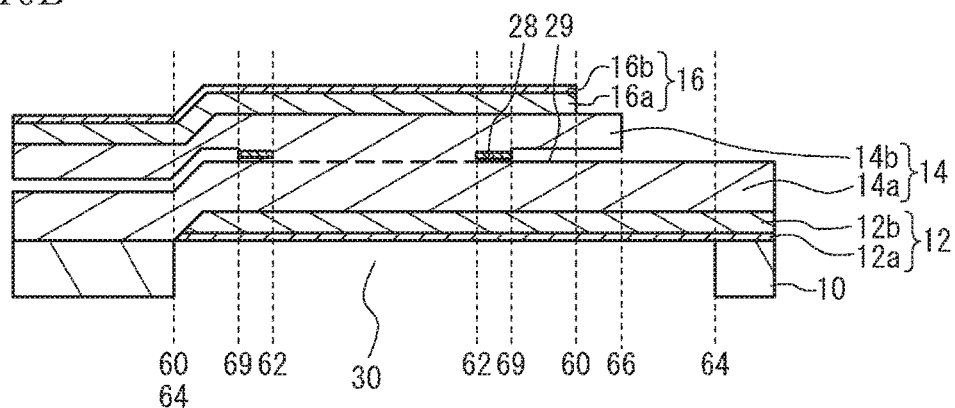
Figure 10C:
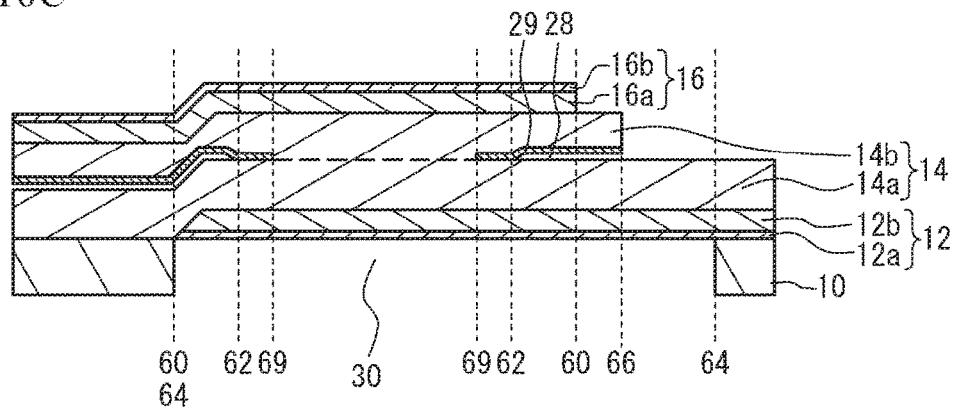

FIG. 10A through FIG. 10C are cross-sectional views of piezoelectric thin film resonators in accordance with an eighth variation of the first embodiment. As illustrated in FIG. 10A through FIG. 10C, in the extraction region of the lower electrode 12, the end face 66 of the upper piezoelectric film 14b is located further in than the outer outline 64 of the air gap 30, and is located outside the resonance region 50. Other structures are the same as those of the first through third variations of the first embodiment, respectively, and the description thereof is thus omitted. In the eighth variation of the first embodiment, the acoustic wave leaking from the resonance region 50 in the lateral direction is reflected or attenuated by the end face 66 of the upper piezoelectric film 14b in addition to the inner outline 62 of the insertion layer 28 and the inner outline 69 of the insertion layer 29. Therefore, the loss of the acoustic wave energy is small, and the Q-value further improves.

Ninth Variation of First Embodiment

Figure 11A:
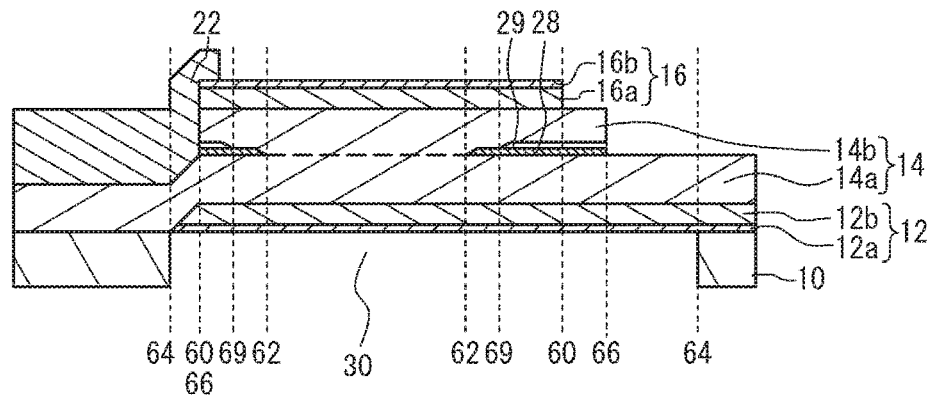
FIG. 11A through FIG. 11C are cross-sectional views of piezoelectric thin film resonators in accordance with a ninth variation of the first embodiment.
Figure 11B:
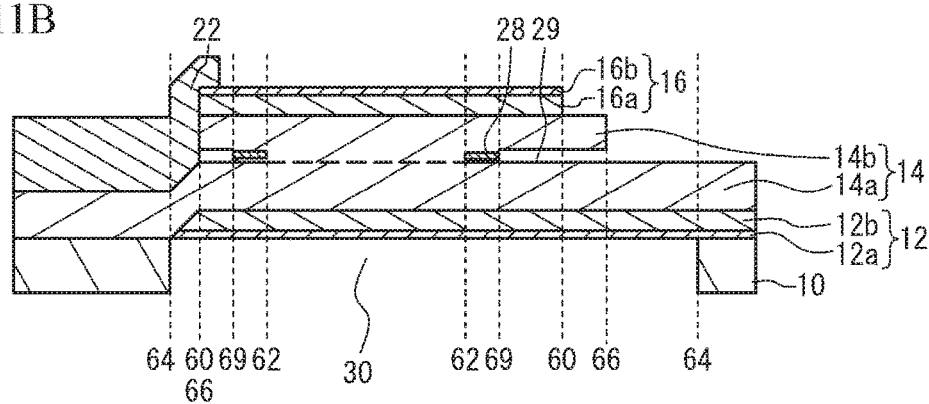
Figure 11C:
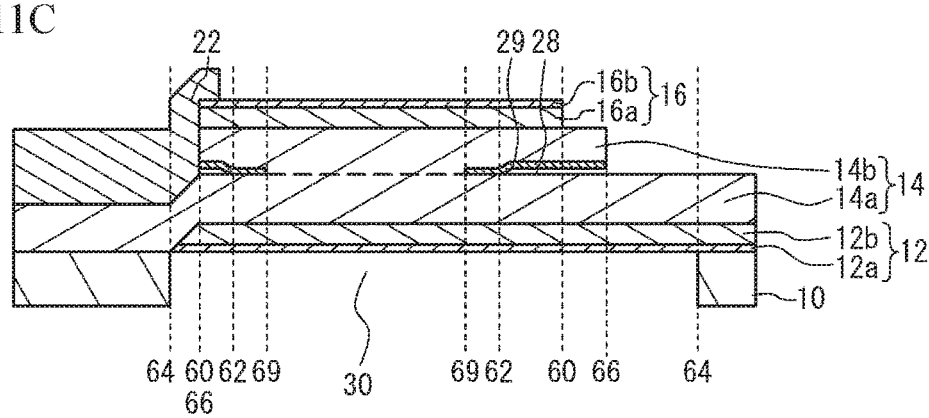

FIG. 11A through FIG. 11C are cross-sectional views of piezoelectric thin film resonators in accordance with a ninth variation of the first embodiment. As illustrated in FIG. 11A through FIG. 11C, in the extraction region of the upper electrode 16, the end face 66 of the upper piezoelectric film 14b is substantially aligned with the outer outline 60 of the resonance region 50, and is located further in than the outer outline 64 of the air gap 30. The upper electrode 16 is coupled to a wiring line 22. Other structures are the same as those of the eighth variation of the first embodiment, and the description thereof is thus omitted. In the ninth variation of the first embodiment, even in the extraction region of the upper electrode 16, the acoustic wave leaking from the resonance region 50 in the lateral direction is reflected or attenuated by the end face 66 of the upper piezoelectric film 14*b* in addition to the inner outline 62 of the insertion layer 28 and the inner outline 69 of the insertion layer 29. Thus, the loss of the acoustic wave energy is small, and the Q-value further improves.

Tenth Variation of First Embodiment

Figure 12A:
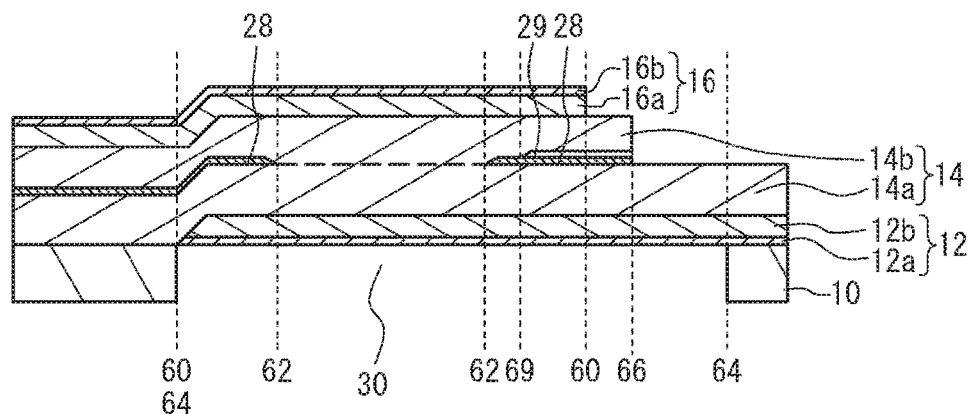
FIG. 12A through FIG. 12C are cross-sectional views of piezoelectric thin film resonators in accordance with a tenth variation of the first embodiment.
Figure 12B:
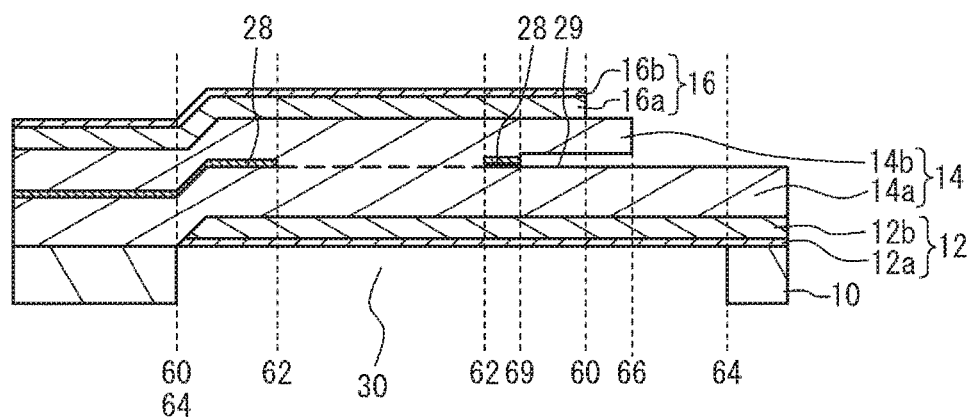
Figure 12C:
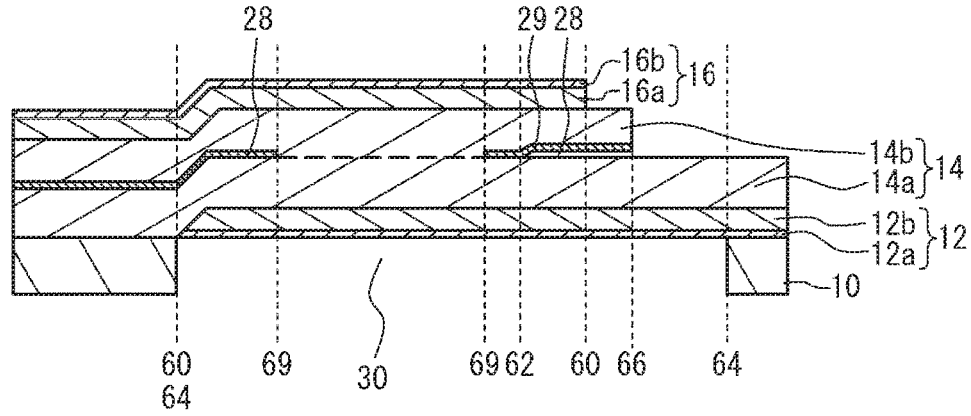

FIG. 12A through FIG. 12C are cross-sectional views of piezoelectric thin film resonators in accordance with a tenth variation of the first embodiment. As illustrated in FIG. 12A through FIG. 12C, no insertion layer 29 is located in the extraction region of the upper electrode 16. Other structures are the same as those of the eighth variation of the first embodiment, and the description thereof is thus omitted. As described in the tenth variation of the first embodiment, it is sufficient if at least one of the insertion layers 28 and 29 is located in at least a part of the outer peripheral region surrounding the center region.

Eleventh Variation of First Embodiment

Figure 13A:
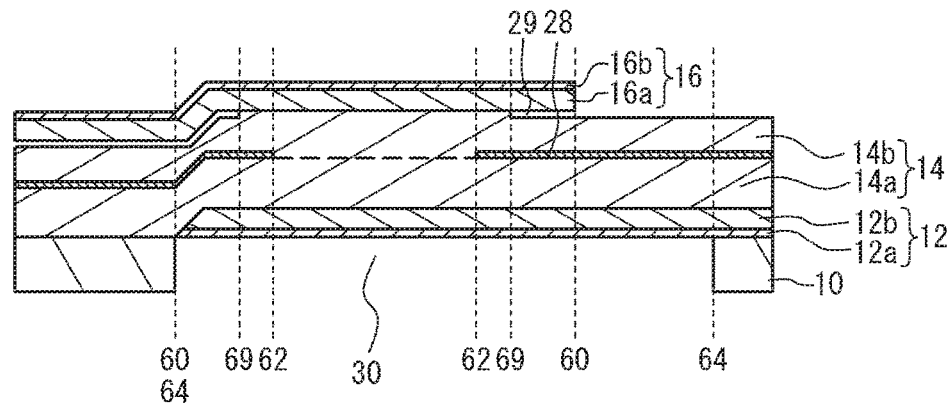
FIG. 13A through FIG. 13C are cross-sectional views of piezoelectric thin film resonators in accordance with an eleventh variation of the first embodiment.

FIG. 13A through FIG. 14A are cross-sectional views of piezoelectric thin film resonators in accordance with an eleventh variation of the first embodiment. As illustrated in FIG. 13A, the insertion layer 28 is a material layer, and the insertion layer 29 is an air layer. The inner outline 62 of the insertion layer 28 is located further in than the inner outline 69 of the insertion layer 29. The insertion layer 28 is located between the lower and upper piezoelectric films 14*a* and 14*b*. The insertion layer 29 is located between the piezoelectric film 14 and the upper electrode 16. The upper piezoelectric film 14*b* extends to the outside of the outer outline 64 of the air gap 30. Other structures are the same as those of the first embodiment, and the description thereof is thus omitted.

Figure 13B:
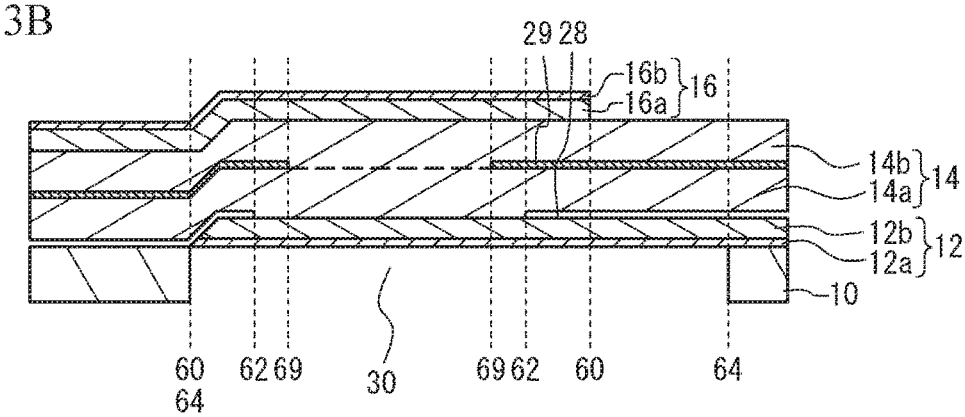

As illustrated in FIG. 13B, the insertion layer 28 is an air layer, and the insertion layer 29 is a material layer. The inner outline 62 of the insertion layer 28 is located further out than the inner outline 69 of the insertion layer 29. The insertion layer 28 is located between the lower electrode 12 and the piezoelectric film 14. The insertion layer 29 is located between the lower and upper piezoelectric films 14*a* and 14*b*. The upper piezoelectric film 14*b* extends to the outside of the outer outline 64 of the air gap 30. Other structures are the same as those of the first embodiment, and the description thereof is thus omitted.

Figure 13C:
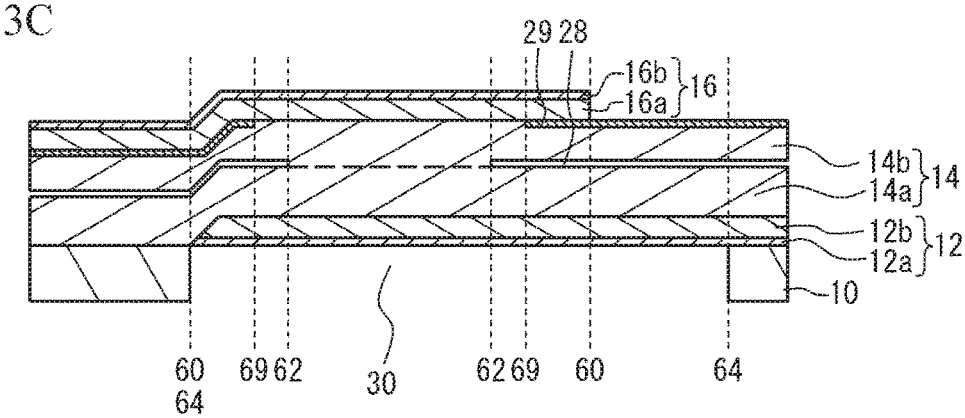

As illustrated in FIG. 13C, the insertion layer 28 is an air layer, and the insertion layer 29 is a material layer. The inner outline 62 of the insertion layer 28 is located further in than the inner outline 69 of the insertion layer 29. The insertion layer 28 is located between the lower and upper piezoelectric films 14*a* and 14*b*. The insertion layer 29 is located between the piezoelectric film 14 and the upper electrode 16. The upper piezoelectric film 14*b* extends to the outside of the outer outline 64 of the air gap 30. Other structures are the same as those of the first embodiment, and the description thereof is thus omitted.

Figure 14A:
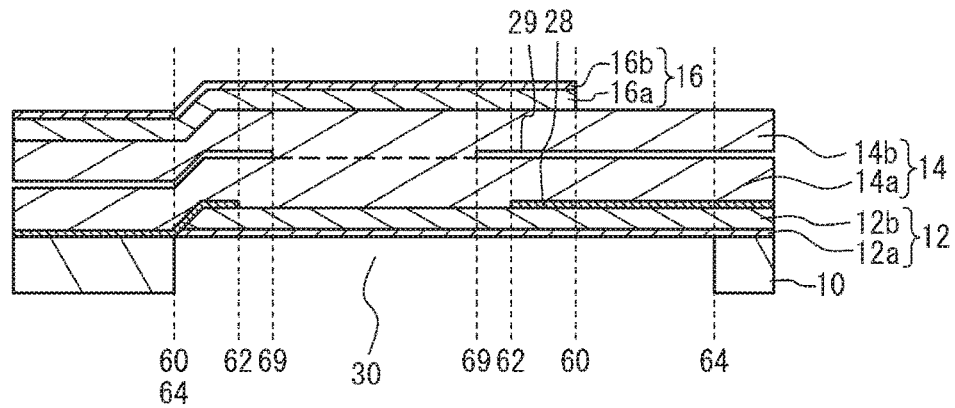
FIG. 14A is a cross-sectional view of a piezoelectric thin film resonator in accordance with the eleventh variation of the first embodiment.
Figure 14B:
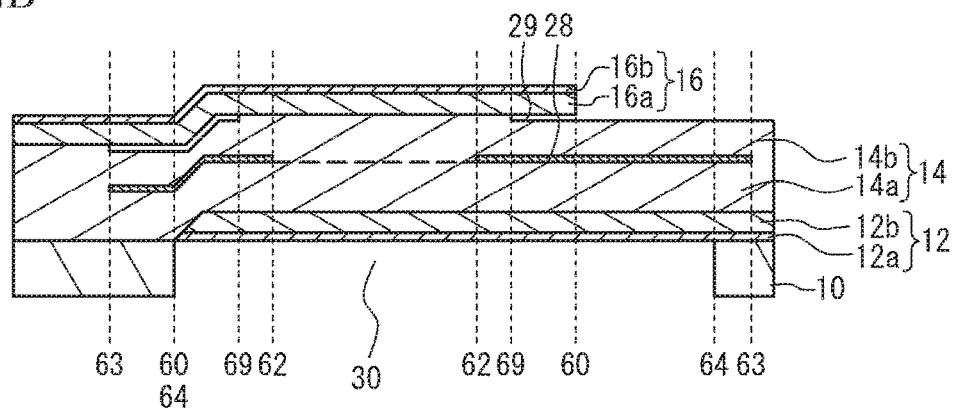
FIG. 14B and FIG. 14C are cross-sectional views of piezoelectric thin film resonators in accordance with a twelfth variation of the first embodiment.
Figure 14C:
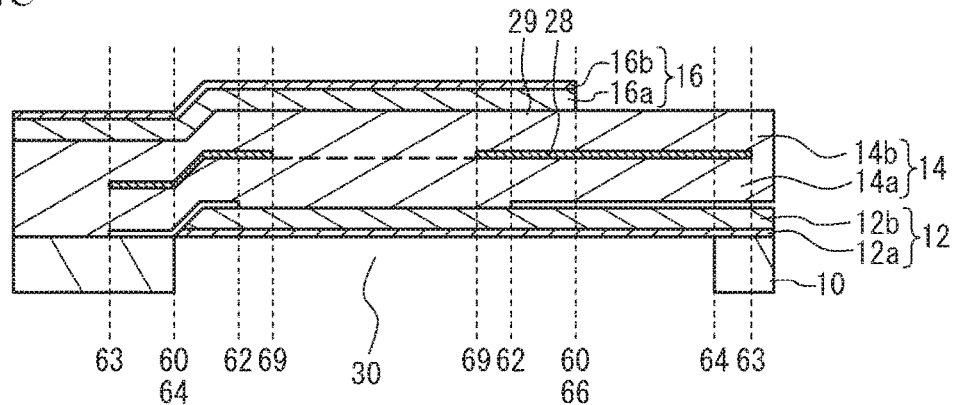
Figure 15A:
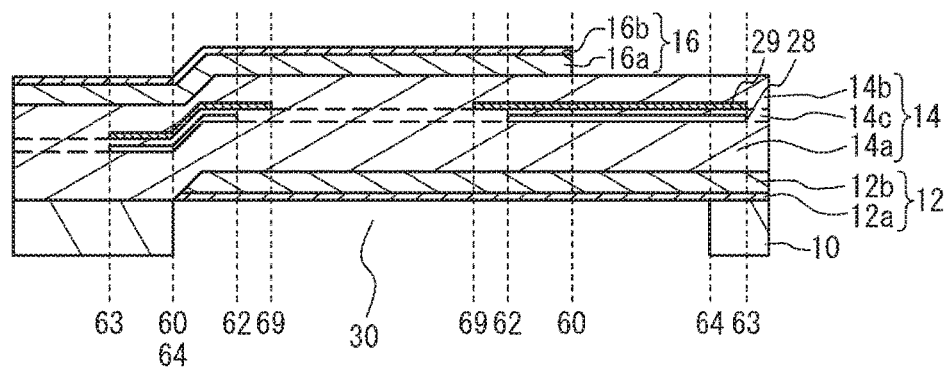
FIG. 15A and FIG. 15B are cross-sectional view of piezoelectric thin film resonators in accordance with the twelfth variation of the first embodiment.
Figure 15B:
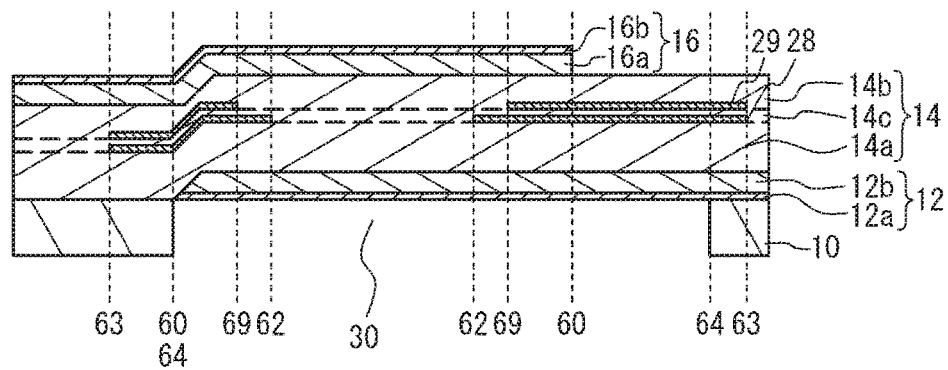

As illustrated in FIG. 14A, the insertion layer 28 is a material layer, and the insertion layer 29 is an air layer. The inner outline 62 of the insertion layer 28 is located further out than the inner outline 69 of the insertion layer 29. The insertion layer 28 is located between the lower electrode 12 and the piezoelectric film 14. The insertion layer 29 is located between the lower and upper piezoelectric films 14*a* and 14*b*. The upper piezoelectric film 14*b* extends to the outside of the outer outline 64 of the air gap 30. Other structures are the same as those of the first embodiment, and the description thereof is thus omitted. As described in the eleventh variation of the first embodiment, at least one of the insertion layers 28 and 29 may be located between the lower electrode 12 and the piezoelectric film 14 or between the piezoelectric film 14 and the upper electrode 16.

Twelfth Variation of First Embodiment

FIG. 14B through FIG. 15B are cross-sectional views of piezoelectric thin film resonators in accordance with a twelfth variation of the first embodiment. As illustrated in FIG. 14B through FIG. 15B, outer outlines 63 of the insertion layers 28 and 29 are located further in than the end face of the piezoelectric film 14. Other structures are the same as those illustrated in FIG. 13A, FIG. 13B, FIG. 8C, and FIG. 9B, respectively, and the description thereof is thus omitted. As described in the twelfth variation of the first embodiment, the outer outline 63 of at least one of the insertion layers 28 and 29 may be located further in than the end face of the piezoelectric film 14. The outer outline 63 of at least one of the insertion layers 28 and 29 may be substantially aligned with the outer outline 60 of the resonance region 50.

Thirteenth Variation of First Embodiment

Figure 16A:
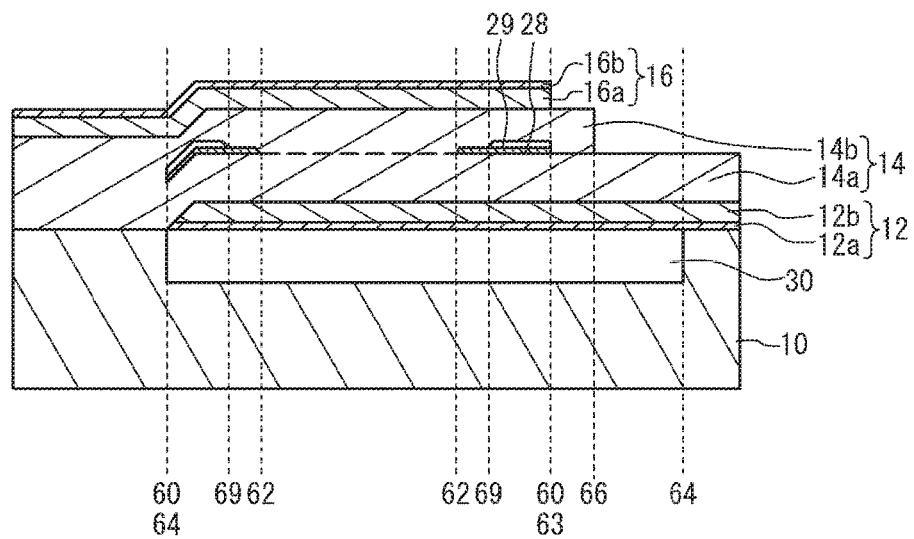
FIG. 16A and FIG. 16B are cross-sectional views of piezoelectric thin film resonators in accordance with thirteenth and fourteenth variations of the first embodiment, respectively.
Figure 16B:
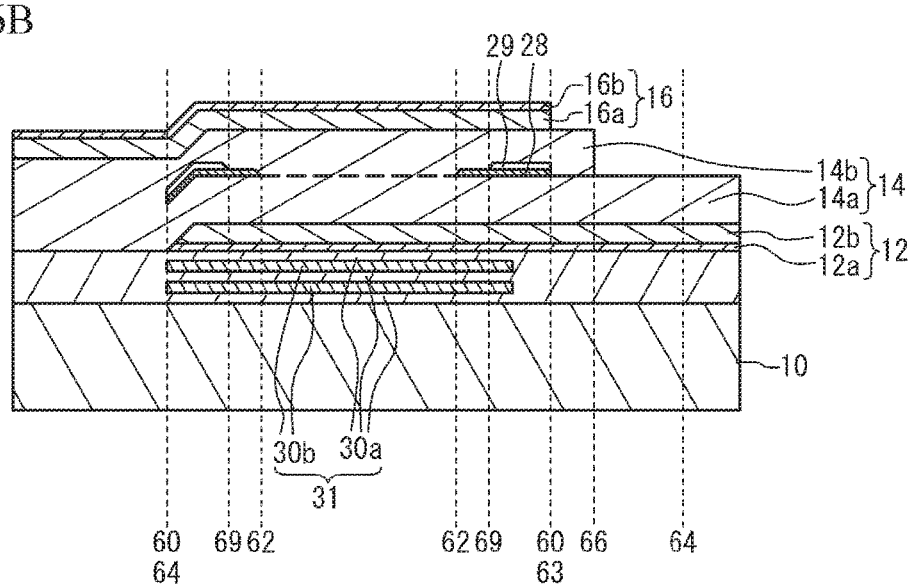

FIG. 16A and FIG. 16B are cross-sectional views of piezoelectric thin film resonators in accordance with thirteenth and fourteenth variations of the first embodiment, respectively. As illustrated in FIG. 16A, a recessed portion is formed on the upper surface of the substrate 10. The lower electrode 12 is flatly formed on the substrate 10. This structure forms the air gap 30 in the recessed portion of the substrate 10. The air gap 30 is formed so as to include the resonance region 50. The outer outlines 63 of the insertion layers 28 and 29 are substantially aligned with the outer outline 60 of the resonance region 50. Other structures are the same as those of the first embodiment, and the description thereof is thus omitted. The air gap 30 may be formed so as to penetrate through the substrate 10. An insulating film may be formed so as to be in contact with the lower surface of the lower electrode 12. That is, the air gap 30 may be formed between the substrate 10 and the insulating film being in contact with the lower electrode 12. The insulating film is, for example, an aluminum nitride film.

Fourteenth Variation of First Embodiment

As illustrated in FIG. 16B, an acoustic mirror 31 is formed under the lower electrode 12 in the resonance region 50. The acoustic mirror 31 includes a film 30*a* with low acoustic impedance and a film 30*b* with high acoustic impedance alternately stacked. The films 30*a* and 30*b* have film thicknesses of, for example, $\lambda/4$ ($\lambda$, is the wavelength of the acoustic wave). The number of the films 30*a* and 30*b* stacked is freely set. It is sufficient if the acoustic mirror 31 includes at least two layers with different acoustic characteristics stacked at intervals. In addition, the substrate 10 may be one of the two layers with different acoustic characteristics of the acoustic mirror 31. For example, the acoustic mirror 31 may have a structure in which a single film with acoustic impedance different from that of the substrate 10 is located in the substrate 10. The outer outlines 63 of the insertion layers 28 and 29 are substantially aligned with the outer outline 60 of the resonance region 50. Other structures are the same as those of the first embodiment, and the description thereof is thus omitted.

In the first embodiment and the first through twelfth variations thereof, the air gap 30 may be formed as in the thirteenth variation of the first embodiment, or the acoustic mirror 31 may be formed instead of the air gap 30 as in the fourteenth variation of the first embodiment.

In the first embodiment and the first through thirteenth variations thereof, the piezoelectric thin film resonator may be a Film Bulk Acoustic Resonator (FBAR) in which the air gap 30 is formed between the substrate 10 and the lower electrode 12 in the resonance region 50. Alternatively, as in the fourteenth variation of the first embodiment, the piezoelectric thin film resonator may be a Solidly Mounted Resonator (SMR) that includes the acoustic mirror 31, which reflects the acoustic wave propagating through the piezoelectric film 14, below the lower electrode 12 in the resonance region 50.

In the first embodiment and the variations thereof, the outer outline 64 of the air gap 30 or the outer outline 64 of the acoustic mirror 31 is substantially aligned with the outer outline 60 of the resonance region 50 in the extraction region 70, but the outer outline 64 of the air gap 30 or the outer outline 64 of the acoustic mirror 31 may be located further out than the outer outline 60 of the resonance region 50. In addition, the resonance region 50 has an elliptical shape, but may have other shapes. For example, the resonance region 50 may have a polygonal shape such as a quadrangle shape or a pentagonal shape.

The effect of the positions of the inner outlines 62 and 69 of the insertion layers 28 and 29 on the resonance characteristics was simulated with a two-dimensional finite element method in the first embodiment and the variations thereof. The material and the film thicknesses of each component used for the simulation are as follows.

Lower layer 12a of the lower electrode 12: Cr film with a film thickness of 100 nm
Upper layer 12b of the lower electrode 12: Ru film with a film thickness of 200 nm
Lower piezoelectric film 14a: AlN film with a film thickness of 630 nm
Upper piezoelectric film 14b: AlN film with a film thickness of 630 nm
Insertion layer 28: Silicon oxide film or air layer with a film thickness of 150 nm
Insertion layer 29: Silicon oxide film or air layer with a film thickness of 150 nm
Lower layer 16a of the upper electrode 16: Ru film with a film thickness of 230 nm
Upper layer 16b of the upper electrode 16: not provided
Width W0 of the resonance region 50 (distance between the center and the outer outline of the resonance region): 42 μm
Distance W3 between the resonance region 50 and the lower piezoelectric film 14a: 8 μm
Distance W4 between the air gap 30 and the resonance region 50: 13 μm The simulation was conducted by applying a mirror condition to the center of the resonance region.

The simulation was conducted on samples A through C as samples of comparative examples and samples D through F as samples of the embodiment. The samples A and B are samples each having one insertion layer. The sample C is a sample having two insertion layers of which the positions of the inner outlines are substantially aligned with each other. The samples D through F are samples having two insertion layers of which the positions of the inner outlines are different.

Figure 17A:
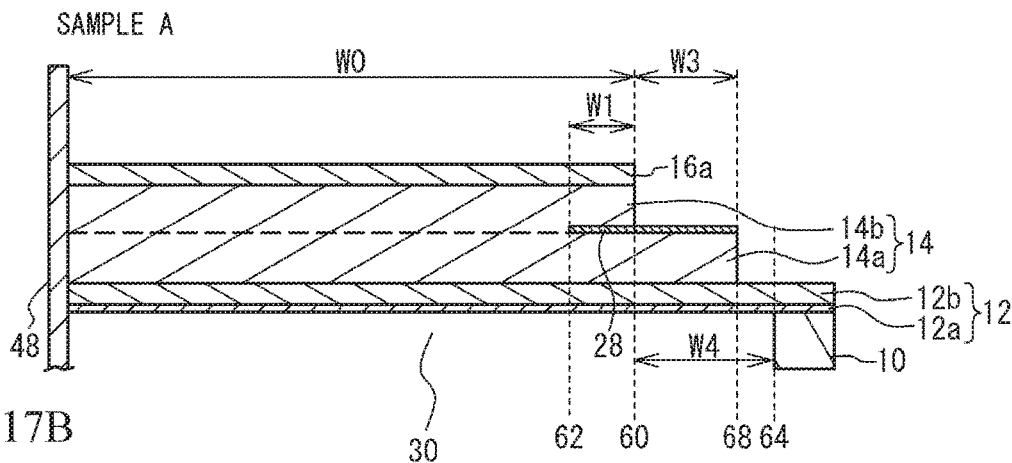
FIG. 17A through FIG. 17C are cross-sectional views of samples A through C that are samples of comparative examples, respectively.
Figure 17B:
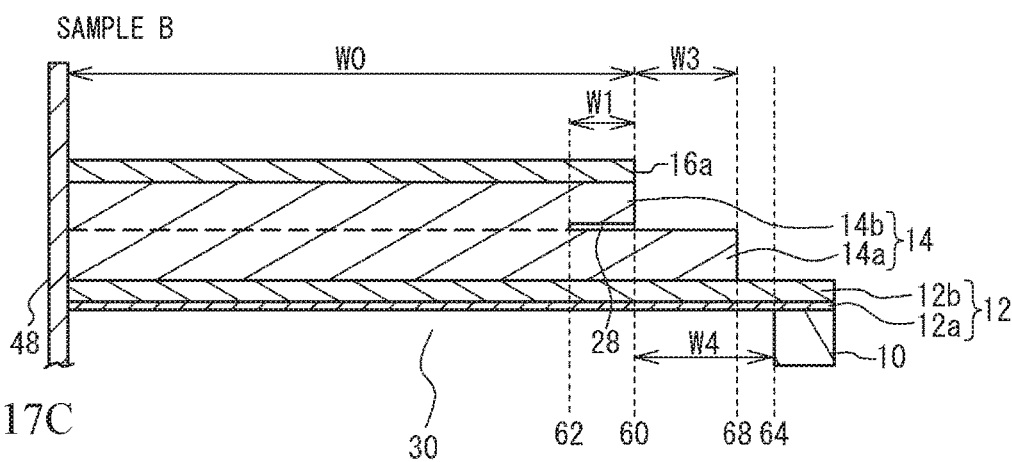
Figure 17C:
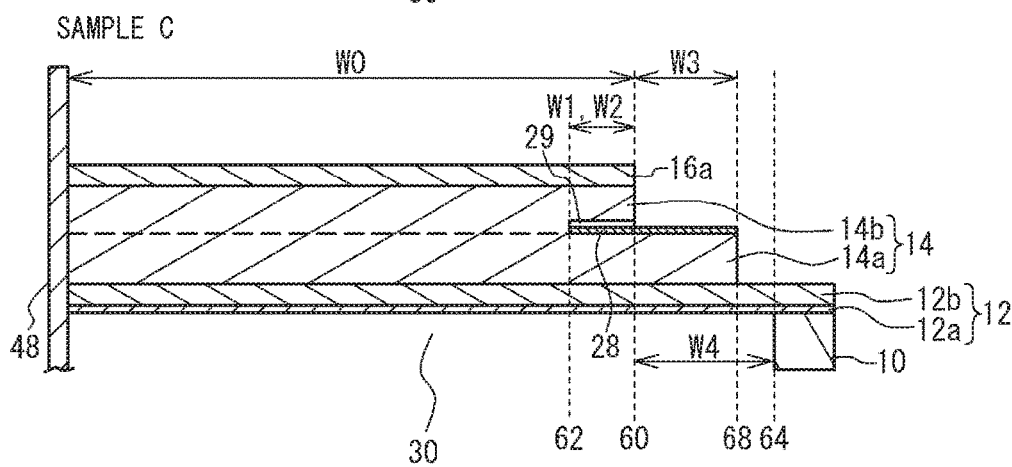

FIG. 17A through FIG. 17C are cross-sectional views of the samples A through C that are samples of comparative examples. As illustrated in FIG. 17A through FIG. 17C, in the sample A, the insertion layer 28 is a material layer, and is a silicon oxide film. The insertion width W1 of the insertion layer 28 is 2.3 μm. In the sample B, the insertion layer 28 is an air layer. The insertion width W1 of the insertion layer 28 is 2.3 μm. In the sample C, the insertion layer 28 is a material layer, and the insertion layer 29 is an air layer. The insertion layers 28 and 29 are in contact with each other. The insertion widths W1 and W2 of the insertion layers 28 and 29 are 2.3 μm. A mirror condition 48 was applied to the center of the resonance region.

Figure 18A:
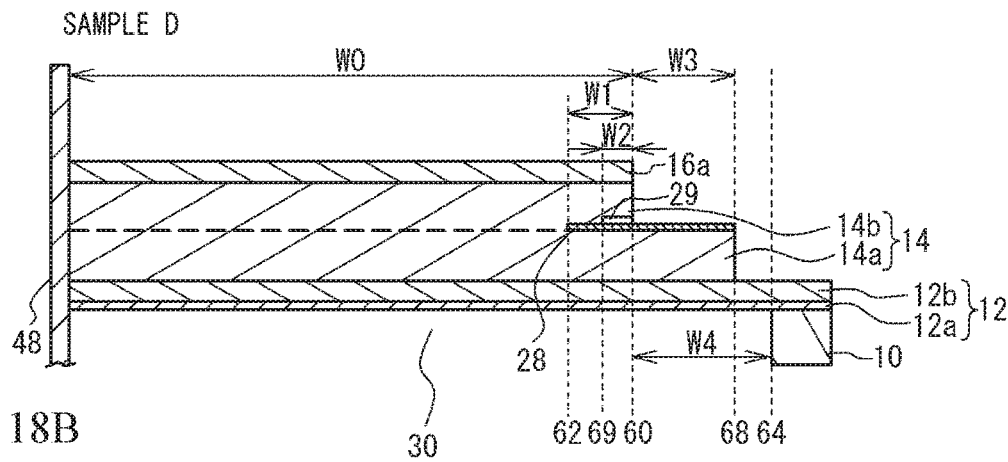
FIG. 18A through FIG. 18C are cross-sectional views of samples D through F that are samples of the embodiment, respectively.
Figure 18B:
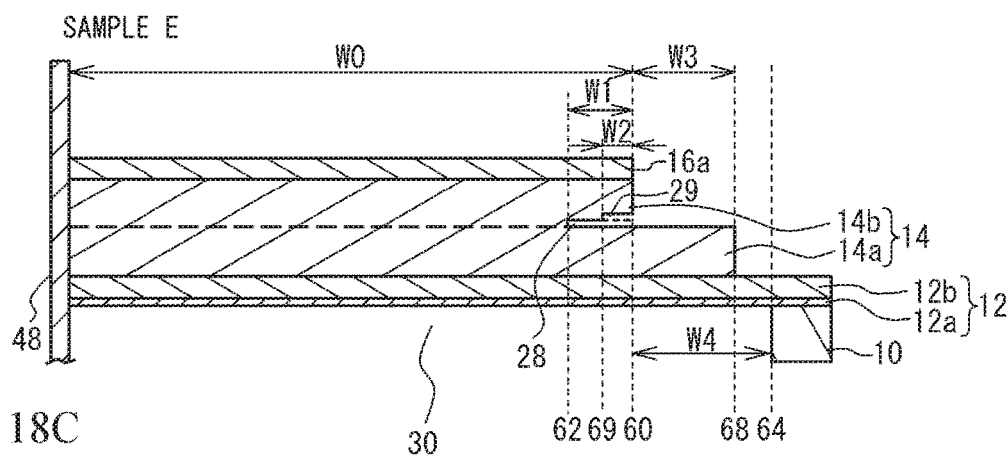
Figure 18C:
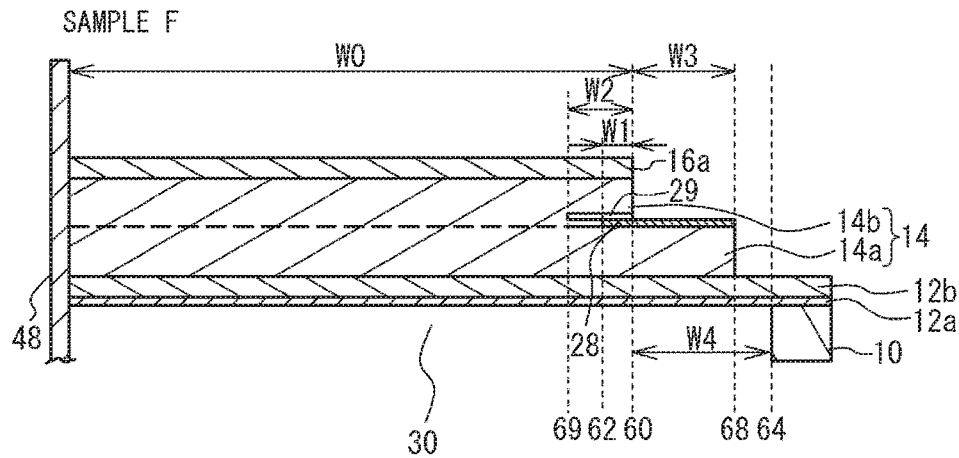

FIG. 18A through FIG. 18C are cross-sectional views of the samples D through F that are samples of the embodiment. As illustrated in FIG. 18A, in the sample D, the insertion layer 28 is a material layer, and is a silicon oxide film. The insertion layer 29 is an air layer. The insertion width W1 of the insertion layer 28 is 2.3 μm, and the insertion width W2 of the insertion layer 29 is 1.6 μm. As illustrated in FIG. 18B, in the sample E, the insertion layers 28 and 29 are air layers. The insertion width W1 of the insertion layer 28 is 2.3 μm, and the insertion width W2 of the insertion layer 29 is 1.1 μm. As illustrated in FIG. 18C, in the sample F, the insertion layer 28 is a material layer, and the insertion layer 29 is an air layer. The insertion width W1 of the insertion layer 28 is 0.6 μm, and the insertion width W2 of the insertion layer 29 is 2.3 μm. The smaller insertion width W1 or W2 of each of the samples D through F was made to be around the insertion width at which the Q-value at the antiresonant frequency becomes the greatest as described later.

FIG. 19 presents the Q-value at the antiresonant frequency and the electromechanical coupling coefficient $k^2$ in the samples A through F. As presented in FIG. 19, when the insertion layer 28 is a material layer as in the sample A, the Q-value at the antiresonant frequency and the electromechanical coupling coefficient $k^2$ are not sufficiently large. When the insertion layer 28 is an air layer as in the sample B, the $k^2$ is large, but the Q-value is small. Even when the insertion layers 28 and 29 are respectively a material layer and an air layer as in the sample C, if the inner outlines 62 and 69 of the insertion layers 28 and 29 are substantially aligned with each other, the Q-value and the $k^2$ are approximately the same as those of the sample B. As seen above, it is difficult to improve both the Q-value and the $k^2$ in the comparative examples.

In the sample D, the Q-value is approximately the same as that of the sample A, and is greater than those of the samples B and C. The $k^2$ is approximately the same as those of the samples B and C, and is greater than that of the sample A. In the samples E and F, both the Q-value and the $k^2$ are greater than those of the samples B and C.

In the sample D, the insertion width W1 of the insertion layer 28 was set to 2.3 μm, and the insertion width W2 of the insertion layer 29 was varied to simulate the Q-value at the antiresonant frequency and the electromechanical coupling coefficient $k^2$. In the sample E, the insertion width W1 of the insertion layer 28 was set to 2.3 μm, and the insertion width W2 of the insertion layer 29 was varied to simulate the Q-value and the $k^2$. In the sample F, the insertion width W2 of the insertion layer 29 was set to 2.3 µm, and the insertion width W1 of the insertion layer 28 was varied to simulate the Q-value and the $k^2$. The greater one of the insertion widths W1 and W2 is set to approximately ¼ of the wavelength of the acoustic wave propagating in the lateral direction. This configuration allows the acoustic wave propagating in the lateral direction to be reflected or attenuated.

Figure 20A:
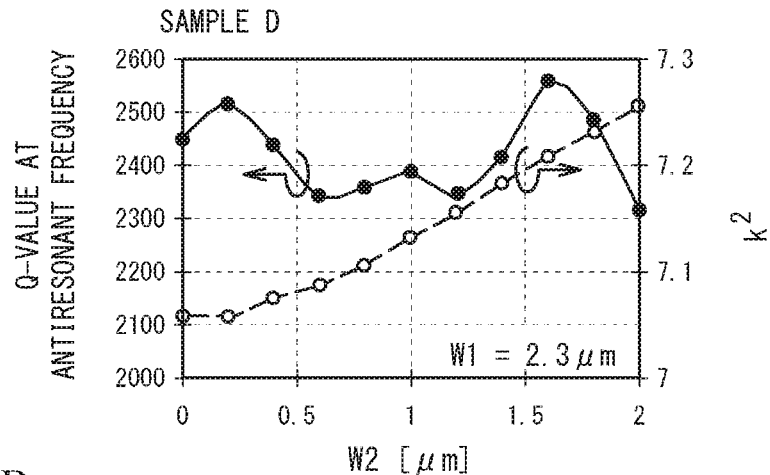
FIG. 20A through FIG. 20C are graphs of Q-value and $k^2$ versus insertion width in the samples D through F.
Figure 20B:
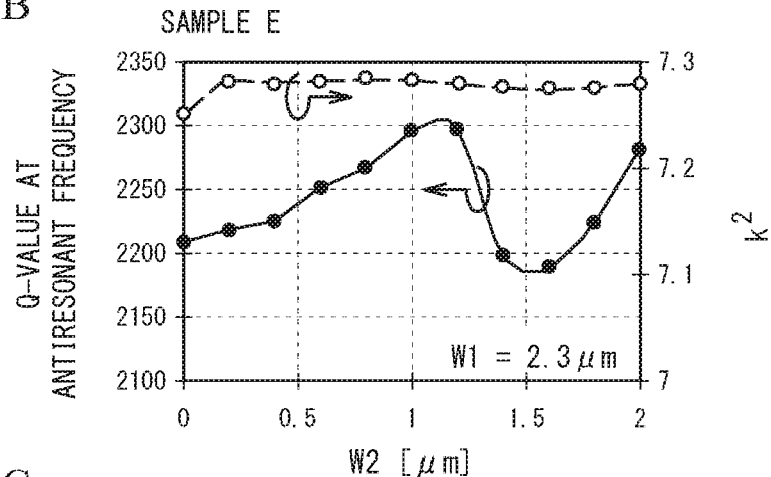
Figure 20C:
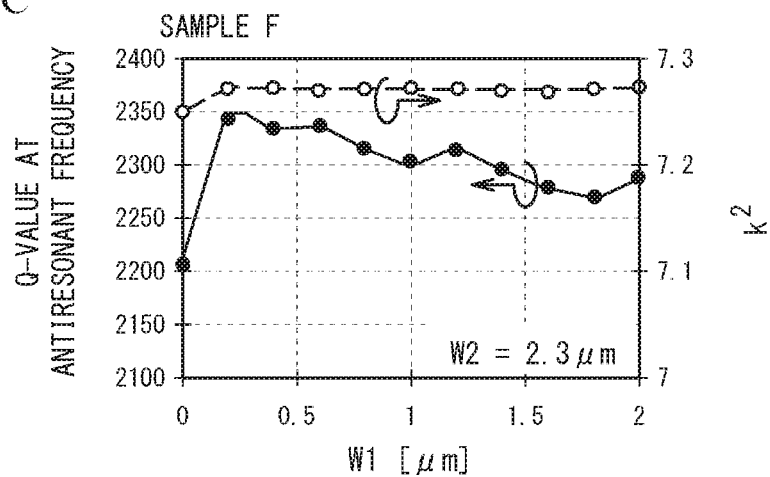

FIG. 20A through FIG. 20C are graphs of Q-value and $k^2$ versus insertion width in the samples D through F. Black circles represent simulation values of the Q-value at the antiresonant frequency, and solid lines are approximate curves. Open circles represent simulation values of the electromechanical coupling coefficient $k^2$, and dashed lines are approximate curves.

In FIG. 20A, the case of W2=0 corresponds to the sample A. The case of W2=2.3 µm corresponds to the sample C. In the sample D, as the insertion width W2 increases, the $k^2$ gradually increases from the sample A. The Q-value depends on the insertion width W2. The Q-value is greater than that of the sample C in any insertion width W2. When the insertion width W2 is optimized, both the Q-value and the $k^2$ can be made to be large.

In FIG. 20B, the case of W2=0 corresponds to the sample B. In the sample E, regardless of the insertion width W2, the $k^2$ is greater than the sample B. Although the Q-value depends on the insertion width W2, the Q-value is greater than that of the sample B in most of the insertion widths W2. When the insertion width W2 is optimized, the $k^2$ can be made to be approximately the same as those of the samples B and C, and the Q-value can be made to be greater than that of the sample B.

In FIG. 20C, the case of W1=0 corresponds to the sample B. The case of W1=2.3 µm corresponds to the sample C. In the sample F, regardless of the insertion width W1, the $k^2$ is greater than that of the sample B. Although the Q-value depends on the insertion width W1, the Q-value is greater than those of the samples B and C in any insertion width W2. When the insertion width W2 is optimized, the $k^2$ can be made to be approximately the same as those of the samples B and C, and the Q-value can be made to be greater than that of the sample B.

As in the samples D through F, the positions of the inner outlines 62 and 69 of a plurality of the insertion layers 28 and 29 are made to be different. That is, the position of the edge of the insertion layer 28 (a first insertion layer) and the position of the edge of the insertion layer 29 (a second insertion layer) are made to be different in the resonance region 50. This structure improves the Q-value even at the same $k^2$ compared to the case where the insertion layer is a single layer as in the samples A and B or the case where a plurality of insertion layers are provided and the inner outlines of the insertion layers are substantially aligned with each other as in the sample C. This is considered because the acoustic wave propagating through the piezoelectric film 14 from the resonance region 50 in the lateral direction is reflected or attenuated at several locations such as the inner outlines 62 and 69. Accordingly, the energy of the acoustic wave is inhibited from leaking to the outside of the resonance region 50. Therefore, the loss is reduced, and the Q-value is improved. The desired Q-value and the desired $k^2$ are achieved by adjusting the materials and/or the insertion widths of the insertion layers 28 and 29.

The insertion layers 28 and 29 have different acoustic impedance as a material layer and an air layer have. This structure can improve the Q-value as in the samples D and F compared to the sample E in which the insertion layers 28 and 29 have the same acoustic impedance. The reason is considered as follows. At the inner outline 69 of the insertion layer 29 of the sample D and the inner outline 62 of the insertion layer 28 of the sample F, the acoustic impedance of the multilayered film greatly changes. Thus, the acoustic wave propagating in the lateral direction is further reflected or attenuated. Therefore, the Q-value improves. At least two layers of a plurality of the insertion layers 28 and 29 may be material layers, and have different acoustic impedance.

When the samples D and F are compared, the Q-value of the sample D is greater. Thus, it is preferable that the inner outline 62 of the insertion layer 28 with the greatest acoustic impedance is located innermost.

A plurality of the insertion layers 28 and 29 have different permittivity as a material layer and an air layer have. When the insertion width of the insertion layer with lower permittivity such as, for example, an air layer is increased as in the sample E illustrated in FIG. 20B, the electromechanical coupling coefficient $k^2$ increases. This is because the electrostatic capacitance that does not contribute to the resonance of longitudinal oscillation Increases when the insertion layer has a high permittivity. Thus, the Q-value and the $k^2$ are adjusted to desired values by making the permittivity of the insertion layers 28 and 29 different. To further improve the $k^2$, at least one of the insertion layers 28 and 29 is preferably an air layer. To yet further improve the $k^2$, the insertion layer of which the inner outline is located innermost is preferably an air layer. At least two layers of a plurality of the insertion layers 28 and 29 may be material layers, and have different relative permittivity.

To further improve the Q-value, as in the sample D, the insertion layer of which the inner outline is located innermost is preferably a material layer, and the insertion layer of which the inner outline is located outermost is preferably an air layer.

A plurality of the insertion layers 28 and 29 may be made of the same material. A plurality of the insertion layers 28 and 29 may be in contact with each other, or may be separated across a part of the piezoelectric film 14. At least one of a plurality of the insertion layers 28 and 29 may be inserted in the piezoelectric film 14, or may be interposed between the piezoelectric film 14 and the lower electrode 12 or between the piezoelectric film 14 and the upper electrode 16. An insertion layer other than the insertion layers 28 and 29 may be provided.

Second Embodiment

Figure 21A:
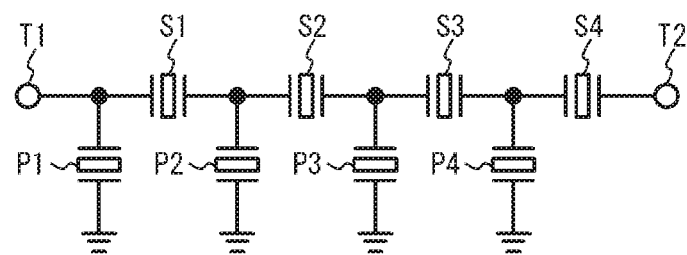
FIG. 21A is a circuit diagram of a filter in accordance with a second embodiment.

A second embodiment is an exemplary filter and an exemplary multiplexer using the piezoelectric thin film resonator in accordance with any one of the first embodiment and the variations thereof. FIG. 21A is a circuit diagram of a filter in accordance with the second embodiment. As illustrated in FIG. 21A, one or more series resonators S1 through S4 are connected in series between an input terminal T1 and an output terminal T2. One or more parallel resonators P1 through P4 are connected in parallel between the input terminal T1 and the output terminal T2. At least one of one or more series resonators S1 through S4 and one or more parallel resonators P1 through P4 may be the acoustic wave resonator of any one of the first embodiment and the variations thereof. The number of resonators in a ladder-type filter can be appropriately configured. The filter including the acoustic wave resonator of any one of the first embodiment and the variations thereof may be a multimode filter instead of a ladder-type filter.

In the second embodiment, the filter includes the piezoelectric thin film resonator of any one of the first embodiment and the variations thereof. Thus, the characteristics including the Q-value and the $k^2$ of the resonator improve, and the characteristics of the filter are thereby improved. For example, the improvement of the Q-value of the resonator makes the skirt characteristics of the filter steep. The improvement of the $k^2$ of the resonator widens the passband of the filter. The skirt characteristics and the passband of the filter can be made to be desired values by making the Q-value and the $k^2$ of the resonator desired values.

Figure 21B:
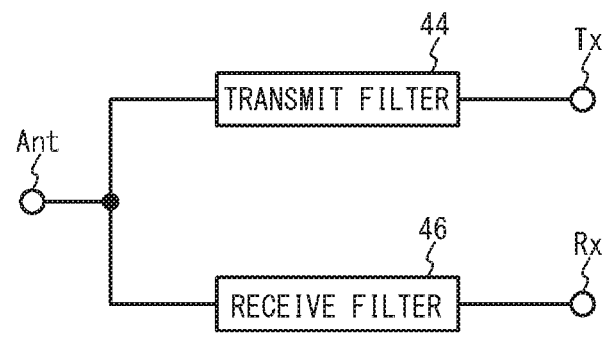
FIG. 21B is a circuit diagram of a duplexer in accordance with a first variation of the second embodiment.

FIG. 21B is a circuit diagram of a duplexer in accordance with a first variation of the second embodiment. As illustrated in FIG. 21B, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies.

In the first variation of the second embodiment, at least one of the transmit filter 44 and the receive filter 46 is the filter of the second embodiment. Alternatively, at least one of the transmit filter 44 and the receive filter 46 is a filter including the piezoelectric thin film resonator of any one of the first embodiment and the variations thereof. This configuration steepens the skirt characteristics and/or widens the passband. In addition, the skirt characteristics and the passband are made to be desired values. A duplexer is described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a piezoelectric film located on the substrate;
   a lower electrode and an upper electrode facing each other across at least a part of the piezoelectric film;
   a first insertion layer located between the lower electrode and the upper electrode and located in at least a part of an outer peripheral region within a resonance region in which the lower electrode and the upper electrode face each other across the piezoelectric film, the first insertion layer being not located in a center region of the resonance region; and
   a second insertion layer located between the lower electrode and the upper electrode and located in at least a part of the outer peripheral region within the resonance region, the second insertion layer being not located in the center region of the resonance region, a position of an inner edge of the second insertion layer in the resonance region being different from a position of an inner edge of the first insertion film in the resonance region in a plan view,
   wherein the first insertion layer and the second insertion layer have different acoustic impedances.

2. The piezoelectric thin film resonator according to claim 1, wherein
   the first insertion layer and the second insertion layer are in contact with each other.

3. The piezoelectric thin film resonator according to claim 2, wherein
   the piezoelectric film includes a lower piezoelectric film and an upper piezoelectric film located on the lower piezoelectric film, and
   the first insertion layer and the second insertion layer is inserted between the lower piezoelectric film and the upper piezoelectric film.

4. The piezoelectric thin film resonator according to claim 1, wherein
   the first insertion layer and the second insertion layer have different permittivities.

5. The piezoelectric thin film resonator according to claim 1, wherein
   the first insertion layer and the second insertion layer are separated across a part of the piezoelectric film.

6. The piezoelectric thin film resonator according to claim 1, wherein
   the piezoelectric film includes a lower piezoelectric film and an upper piezoelectric film located on the lower piezoelectric film, and
   at least one of the first insertion layer and the second insertion layer is inserted between the lower piezoelectric film and the upper piezoelectric film.

7. The piezoelectric thin film resonator according to claim 1, wherein
   at least one of the first insertion layer and the second insertion layer is located between the piezoelectric film and the lower electrode or between the piezoelectric film and the upper electrode.

8. The piezoelectric thin film resonator according to claim 1, wherein
   at least one of the first insertion layer and the second insertion layer is an air layer.

9. The piezoelectric thin film resonator according to claim 1, wherein
   the resonance region is defined by a region where the lower electrode and the upper electrode face each other across the piezoelectric film;
   the first insert film and the second insert film are located at an outer circumference of the resonance region and along the outer circumference of the resonance region within at least a part of a region surrounding the center region of the resonance region and overlap each other within the at least a part of the region surrounding the center region.

10. A filter comprising:
    a piezoelectric thin film resonator including:
       a substrate;
       a piezoelectric film located on the substrate;
       a lower electrode and an upper electrode facing each other across at least a part of the piezoelectric film;
       a first insertion layer located between the lower electrode and the upper electrode and located in at least a part of an outer peripheral region within a resonance region in which the lower electrode and the upper electrode face each other across the piezoelectric film, the first insertion layer being not located in a center region of the resonance region; and
       a second insertion layer located between the lower electrode and the upper electrode and located in at least a part of the outer peripheral region within the resonance region, the second insertion layer being not located in the center region of the resonance region, a position of an inner edge of the second insertion layer in the resonance region being different from a position of an inner edge of the first insertion film in the resonance region in a plan view, wherein the first insertion layer and the second insertion layer have different acoustic impedances.

11. A multiplexer comprising:

a filter including a piezoelectric thin film resonator, wherein the piezoelectric thin film resonator includes:

a substrate;

a piezoelectric film located on the substrate;

a lower electrode and an upper electrode facing each other across at least a part of the piezoelectric film;

a first insertion layer located between the lower electrode and the upper electrode and located in at least a part of an outer peripheral region within a resonance region in which the lower electrode and the upper electrode face each other across the piezoelectric film, the first insertion layer being not located in a center region of the resonance region; and a second insertion layer located between the lower electrode and the upper electrode and located in at least a part of the outer peripheral region within the resonance region, the second insertion layer being not located in the center region of the resonance region, a position of an inner edge of the second insertion layer in the resonance region being different from a position of an inner edge of the first insertion film in the resonance region in a plan view, wherein the first insertion layer and the second insertion layer have different acoustic impedances.

* * * * *